US011276555B2

(12) United States Patent
Sugiyama et al.

(10) Patent No.: US 11,276,555 B2
(45) Date of Patent: Mar. 15, 2022

(54) CHARGED PARTICLE BEAM APPARATUS, COMPOSITE CHARGED PARTICLE BEAM APPARATUS, AND CONTROL METHOD FOR CHARGED PARTICLE BEAM APPARATUS

(71) Applicant: HITACHI HIGH-TECH SCIENCE CORPORATION, Tokyo (JP)

(72) Inventors: Yasuhiko Sugiyama, Tokyo (JP); Koji Nagahara, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/072,678

(22) Filed: Oct. 16, 2020

(65) Prior Publication Data

US 2021/0118645 A1 Apr. 22, 2021

(30) Foreign Application Priority Data

Oct. 18, 2019 (JP) .............................. JP2019-191370

(51) Int. Cl.
*H01J 37/28* (2006.01)
*H01J 37/12* (2006.01)
*H01J 37/147* (2006.01)

(52) U.S. Cl.
CPC .............. *H01J 37/28* (2013.01); *H01J 37/12* (2013.01); *H01J 37/1474* (2013.01); *H01J 2237/04924* (2013.01); *H01J 2237/24564* (2013.01)

(58) Field of Classification Search
CPC .. H01J 37/00; H01J 37/02; H01J 37/10; H01J 37/12; H01J 37/141; H01J 37/147;
(Continued)

(56) References Cited

U.S. PATENT DOCUMENTS 7,335,893 B2* 2/2008 Pearl .................... H01J 37/1471
250/310
2006/0175548 A1* 8/2006 Kawasaki ............. H01J 37/153
250/310
(Continued)

FOREIGN PATENT DOCUMENTS

JP 1993-035540 A 2/1993
JP H10106474 A 4/1998
(Continued)

OTHER PUBLICATIONS

Rauscher et al., "Low Energy Focused Ion Beam System Design," American Vacuum Society, vol. 24, No. 4, published Jun. 14, 2006 (12 pages).

*Primary Examiner* — Jason L McCormack
(74) *Attorney, Agent, or Firm* — Holland & Hart LLP

(57) ABSTRACT

The charged particle beam apparatus includes: a charged particle source configured to generate charged particles; a plurality of scanning electrodes configured to generate electric fields for deflecting charged particles that are emitted by applying an acceleration voltage to the charged particle source, and applying an extraction voltage to an extraction electrode configured to extract the charged particles; an electrostatic lens, which is provided between the plurality of scanning electrodes and a sample table, and is configured to focus a charged particle beam deflected by the plurality of scanning electrodes; and a processing unit configured to obtain a measurement condition, and set each of scanning voltages to be applied to the plurality of scanning electrodes based on the obtained measurement condition.

10 Claims, 17 Drawing Sheets

(58) Field of Classification Search
CPC .......... H01J 37/063; H01J 37/04; H01J 37/21; H01J 37/26; H01J 37/261; H01J 37/28; H01J 37/1474; H01J 37/248; H01J 37/20; H01J 37/3053; H01J 2237/04924; H01J 2237/24564
USPC .............................. 250/306, 307, 311, 396 R
See application file for complete search history.

(56) References Cited

U.S. PATENT DOCUMENTS

| | | | |
|---|---|---|---|
| 2011/0186745 A1* | 8/2011 | Kqaga | H01J 37/08 250/396 R |
| 2012/0126459 A1* | 5/2012 | Ohishi | H01J 37/3177 264/485 |
| 2016/0217967 A1* | 7/2016 | Dohi | H01J 37/1472 |
| 2019/0066969 A1* | 2/2019 | Bizen | H01J 37/1474 |

FOREIGN PATENT DOCUMENTS

| | | |
|---|---|---|
| JP | H11223588 | 8/1999 |
| JP | 2007103108 A | 4/2007 |
| JP | 2007193977 | 8/2007 |
| JP | 2009272293 | 11/2009 |
| JP | 2013196862 A | 9/2013 |

* cited by examiner

SCANNING VOLTAGE INFORMATION

| ACCELERATION VOLTAGE VALUE (kV) | 10 | |
|---|---|---|
| ACCELERATION VOLTAGE VALUE (kV) | 5 | |
| ACCELERATION VOLTAGE VALUE (kV) | 30 | |
| OPERATION MODE | ACCELERATION MODE | DECELERATION MODE |
| RATIO BETWEEN FIRST VOLTAGE VALUE AND SECOND VOLTAGE VALUE | 1 : 0.953 | 1 : 0.942 |
| FIRST VOLTAGE VALUE (V) | 210 | 228 |

SCANNING VOLTAGE INFORMATION   92a

| ACCELERATION VOLTAGE VALUE (kV) | 30 | 1 | 5 |
|---|---|---|---|
| OPERATION MODE | DECELERATION MODE | ACCELERATION MODE | ACCELERATION MODE |
| BEAM BOOSTER VOLTAGE VALUE (kV) | 0 | −5 | −5 |
| PRINCIPAL SURFACE POSITION (mm) | −24.6 | −29.0 | −23.7 |
| RATIO BETWEEN FIRST VOLTAGE VALUE AND SECOND VOLTAGE VALUE | 1:0.942 | 1:0.986 | 1:0.937 |
| FIRST VOLTAGE VALUE (V) | 228 | 35.5 | 80 |

CHARGED PARTICLE BEAM APPARATUS, COMPOSITE CHARGED PARTICLE BEAM APPARATUS, AND CONTROL METHOD FOR CHARGED PARTICLE BEAM APPARATUS

The present application claims priorities to Japanese Patent Application No. 2019-191370, filed Oct. 18, 2019, the entire content of which is incorporated herein for all purposes by this reference.

BACKGROUND OF THE INVENTION

1. Field of the Invention

The present invention relates to a charged particle beam apparatus, a composite charged particle beam apparatus, and a control method for a charged particle beam apparatus.

2. Description of the Related Art

In processing a sample shape typically for producing a sample for a transmission electron microscope (TEM) with the use of a focused ion beam (FIB) apparatus, there is a demand to minimize damage that may be applied to a sample by irradiation with an ion beam. To meet the demand, an acceleration energy of the ion beam is reduced to several kV or lower to process the sample.

Specifically, there has been known a technology of processing a sample shape, in which rough processing is performed at 30 kV and finishing processing is performed at 10 kV (see, for example, Japanese Patent No. 3333731). There has been also known a technology of effectively removing a damaged layer by reducing energy of an ion beam used for finishing processing and also by optimizing an incident angle of the ion beam to a sample in accordance with a sample shape (see, for example, Japanese Patent No. 5142240). There has been also known a technology of reducing an acceleration voltage so as to reduce a damaged layer (see, for example, Japanese Patent No. 5537050).

However, when the acceleration voltage of the focused ion beam is reduced, there are prominently seen an increase in amount of beam blur caused by chromatic aberration and expansion of a beam profile caused by the Coulomb interaction. That is, when the reduced acceleration voltage is used, chromatic aberration is increased and an ion beam cannot be sufficiently concentrated. Thus, a fine ion probe cannot be achieved. As a solution to the above-mentioned problem, there has been known a technology of selectively causing an acceleration lens operation and a deceleration lens operation in accordance with an acceleration voltage to act so that chromatic aberration hardly changes (see, for example, Japanese Patent Application Laid-open No. Hei 5-35540).

There has been also known a beam booster technology of increasing potential energy in an intermediate portion of an optical system and decreasing the potential energy with the use of an objective lens (see, for example, Japanese Patent Application Laid-open No. 2007-103108, and Michael Rauscher and Erich Plies, "Low Energy focused ion beam system design," Journal of Vacuum Science & Technology A, American Vacuum Society, 2006, 24(4), pp. 1055-1066).

The focused ion beam may be used at a higher acceleration voltage (for example, 30 kV) at the time of processing and etching, and at a reduced acceleration voltage (for example, from 1 kV to 5 kV) at the time of finishing processing so as to remove a damage layer resulting from the processing.

Further, concurrently with the reduction of the acceleration voltage, an operation mode of the optical system may be switched from a deceleration mode to an acceleration mode. When the mode of the optical system is switched concurrently with the reduction of the acceleration voltage, a principal surface of an objective lens is changed.

Still further, a booster potential may be applied concurrently with the reduction of the acceleration voltage. When the booster potential is applied concurrently with the reduction of the acceleration voltage, the principal surface of the objective lens is changed.

Now, the change of the principal surface of the objective lens is described.

FIG. 1 is a schematic view for illustrating how the principal surface of the objective lens moves when the objective lens is switched between the acceleration mode and deceleration mode. An objective lens OL includes an incident side electrode IE, a center electrode CE, and an exit side electrode OE. The lens principal surface in the acceleration mode is represented by an imaginary objective lens 10a. The lens principal surface in the deceleration mode is represented by an imaginary objective lens 10b. The imaginary objective lens is a conceptual one used only for the purpose of illustrating the trajectory of an ion beam. An actual lens is an electrostatic lens formed by an electric field that is generated, by applying a voltage to the center electrode CE, among the incident side electrode IE, the center electrode CE, and the exit side electrode OE. In a case of focusing the ion beam onto the same position on a sample S, when the acceleration mode and the deceleration mode are switched, the trajectory of the ion beam in the objective lens OL is changed. Specifically, as illustrated in FIG. 1, in the deceleration mode, the trajectory is significantly changed in a lower portion of the objective lens OL compared with the acceleration mode. Consequently, the lens principal surface in the deceleration mode as represented by the imaginary objective lens 10b is located below the lens principal surface in the acceleration mode as represented by the imaginary objective lens 10a.

FIG. 2 is a schematic view for illustrating how the principal surface of the objective lens moves when the booster voltage is applied. The objective lens OL includes the incident side electrode IE, the center electrode CE, and the exit side electrode OE. The lens principal surface with the booster voltage being zero is represented by an imaginary objective lens 10c. The lens principal surface with the booster voltage being applied is represented by an imaginary objective lens 10d. In a case of focusing the ion beam onto the same position on the sample S, when the booster voltage is applied, the trajectory of the ion beam in the objective lens OL is changed. Specifically, as illustrated in FIG. 2, when the booster voltage is applied, the trajectory is significantly changed in a lower portion of the objective lens OL compared with a case of applying no booster voltage. Consequently, the lens principal surface with the booster voltage being applied as represented by the imaginary objective lens 10d is located below the lens principal surface with no booster voltage being applied as represented by the imaginary objective lens 10c.

Description is now given of a focused ion beam apparatus including, as beam scanning electrodes, two-stage scanning electrodes installed in a previous stage of the objective lens OL. A case involving the movement of the lens principal surface is described here. With the configuration in which the two-stage scanning electrodes are installed in the previous stage of the objective lens OL, the objective lens OL can be placed closer to the sample S, and hence a focal length can be shortened. This configuration can suppress a blur caused by lens aberration, and is therefore generally used.

FIG. 3 is a view for illustrating Example 1 of beam scanning with the use of the two-stage scanning electrodes. In FIG. 3, there are illustrated an imaginary objective lens 10e, the incident side electrode IE, the center electrode CE, the exit side electrode OE, a first scanning electrode 44, and a second scanning electrode 45. In the illustrated example of FIG. 3, no booster voltage is applied. The lens principal surface with the booster voltage being zero is represented by the imaginary objective lens 10e. As illustrated in FIG. 3, the two-stage scanning electrodes are used to scan a beam B so that the beam B passes through the lens principal surface on an optical axis. However, in this configuration, the beam is scanned via the objective lens OL with the use of the two-stage scanning electrodes installed in the previous stage of the objective lens OL. Thus, the scanned beam may be affected by a lens action.

FIG. 4 is a view for illustrating Example 2 of beam scanning with the use of the two-stage scanning electrodes. In FIG. 4, there are illustrated an imaginary objective lens 10f, the incident side electrode IE, the center electrode CE, the exit side electrode OE, the first scanning electrode 44, and the second scanning electrode 45. In the illustrated example of FIG. 4, the booster voltage is applied. The lens principal surface with the booster voltage being applied is represented by the imaginary objective lens 10f. When the booster voltage is applied, the trajectory is significantly changed in a lower portion of the objective lens OL compared with the case of applying no booster voltage. Consequently, the lens principal surface with the booster voltage being applied as represented by the imaginary objective lens 10f is located below the lens principal surface with no booster voltage being applied as represented by the imaginary objective lens 10e in FIG. 3.

In this case, when the beam B is scanned with the same voltage as that of the two-stage scanning electrodes of FIG. 3 so as to pass through the lens principal surface on the optical axis, the beam passes through a position corresponding to the principal surface of the imaginary objective lens 10e. However, the principal surface is moved to the imaginary objective lens 10f, and hence the beam fails to pass through the principal surface, and undergoes the lens action. As illustrated in FIG. 4, when the scanned beam undergoes the lens action, the beam trajectory is refracted. Due to the refraction of the beam trajectory, a desired beam scanning width cannot be obtained at the time of the scanning. Regarding an amplitude of the beam, for example, when no booster voltage is applied, a beam scanning width w1 is obtained, whereas when the booster voltage is applied, a beam scanning width w2 is obtained. When there is a large influence of the lens action, a scanned image has distortion. Otherwise, even when the distortion is small, the linearity of a scanning distance is lost. This affects dimensional precision of the scanned image.

That is, when the mode of the lens is changed, the beam trajectory is changed and then, the principal surface of the lens is moved, with the result that the beam may not be scanned to pass through the lens principal surface on the optical axis. The linearity of the scanning may not be therefore maintained. In some cases, when the linearity of the scanning cannot be maintained, a scanned image of a sample surface has distortion, with the result that the sample surface may not be observed with a precise dimension, or processing may not be accurately performed through beam scanning.

Even when the method described in Japanese Patent No. 3544438 is applied to this problem, this method gives no solution. In Japanese Patent No. 3544438, there is description about storing, in a computer, values of voltages impressed on the objective lens so as to carry out a plurality of workings. However, scanning electrodes are positioned below the objective lens, and also provided in one stage unlike the configuration of the present application. Further, there is no description about how to control the plurality of scanning electrodes. It is therefore impossible to guess what problem occurs in what way, and how to set a plurality of scanning voltages.

Even when the method described in Japanese Patent No. 5969229 is applied to this problem, this method gives no solution. The method of Japanese Patent No. 5969229 is directed to controlling a condenser voltage of a condenser lens, and is intended to set the condenser voltage so as to adjust a beam current. In Japanese Patent No. 5969229, there is no description about a plurality of scanning electrodes and about scanning a beam through an objective lens. It is therefore impossible to guess what problem occurs in what way and how to set a plurality of scanning voltages.

SUMMARY OF THE INVENTION

The present invention has been made in view of the foregoing, and has an object to provide a charged particle beam apparatus, a composite charged particle beam apparatus, and a control method for a charged particle beam apparatus, with which in the charged particle beam apparatus including an electrostatic lens, for example, an objective lens OL, and two-stage scanning electrodes installed in a previous stage of the electrostatic lens, when the objective lens is switched between an acceleration mode and a deceleration mode, or an application voltage of a booster electrode that forms the objective lens is changed, it is possible to obtain a scanned image of a sample surface without any distortion and with a precise dimension at the same level as an image before the switching or the change.

In order to solve the above-mentioned problem to achieve the above-mentioned object, the present invention adopts the following aspects.

(1) According to at least one aspect of the present invention, there is provided a charged particle beam apparatus including: a charged particle source configured to generate charged particles; a plurality of scanning electrodes configured to generate electric fields for deflecting charged particles that are emitted by applying an acceleration voltage to the charged particle source, and applying an extraction voltage to an extraction electrode configured to extract the charged particles; an electrostatic lens, which is provided between the plurality of scanning electrodes and a sample table, and is configured to focus a charged particle beam deflected by the plurality of scanning electrodes; and a processing unit configured to obtain a measurement condition, and set each of scanning voltages to be applied to the plurality of scanning electrodes based on the obtained measurement condition.

(2) In the charged particle beam apparatus according to the above-mentioned aspect (1), the processing unit is configured to obtain, from scanning voltage information in which a measurement condition and information that specifies a scanning voltage to be applied by each of the plurality of scanning electrodes are associated with each other, a plurality of pieces of information that each specify a scanning voltage corresponding to the obtained measurement condition, so as to set each of the plurality of scanning voltages based on the obtained plurality of pieces of information that each specify a scanning voltage, and the scanning voltage information is derived based on the measurement condition.

(3) In the charged particle beam apparatus according to the above-mentioned aspect (1) or (2), the plurality of scanning electrodes include: a first scanning electrode configured to apply a first scanning voltage to the charged particle beam; and a second scanning electrode, which is provided between the first scanning electrode and the sample table, and is configured to apply a second scanning voltage to the charged particle beam.

(4) In the charged particle beam apparatus according to any one of the above-mentioned aspects (1) to (3), the measurement condition includes information that specifies an acceleration voltage and information that specifies an operation mode.

(5) In the charged particle beam apparatus according to any one of the above-mentioned aspects (1) to (3), the charged particle beam apparatus further includes a beam booster voltage application unit, which is provided between the charged particle source and the sample table, and is configured to apply a beam booster voltage to the charged particle beam, and the measurement condition includes information that specifies an acceleration voltage and information that specifies the beam booster voltage.

(6) In the charged particle beam apparatus according to the above-mentioned aspect (5), the processing unit is configured to obtain, from beam booster voltage information in which a measurement condition and information that specifies a beam booster voltage to be applied by the beam booster voltage application unit are associated with each other, information that specifies a beam booster voltage corresponding to the obtained measurement condition, and set the beam booster voltage information based on the obtained information that specifies a beam booster voltage.

(7) According to at least one aspect of the present invention, there is provided a composite charged particle beam apparatus including: the charged particle beam apparatus of the above-mentioned aspect (5); and an electron beam column. In the composite charged particle beam apparatus, the processing unit is configured to set the beam booster voltage based on the acceleration voltage, a focal length of the charged particle beam focused by the electrostatic lens, and an irradiation position of an electron beam applied by an electron beam irradiation unit configured to apply the electron beam.

(8) In the composite charged particle beam apparatus according to the above-mentioned aspect (7), a focus position of the charged particle beam focused by the electrostatic lens matches the irradiation position of the electron beam.

(9) In the composite charged particle beam apparatus according to the above-mentioned aspect (7) or (8), the processing unit is configured to obtain, from beam booster voltage information in which a measurement condition and information that specifies a beam booster voltage to be applied by the beam booster voltage application unit are associated with each other, information that specifies a beam booster voltage corresponding to the obtained measurement condition, and set the beam booster voltage information based on the obtained information that specifies a beam booster voltage.

(10) According to at least one aspect of the present invention, there is provided a control method for a charged particle beam apparatus, the control method including: causing a charged particle source to emit charged particles by applying an acceleration voltage to the charged particle source and applying an extraction voltage to an extraction electrode configured to extract the charged particles; obtaining a measurement condition to set, based on the obtained measurement condition, each of a plurality of scanning voltages to be applied to a plurality of scanning electrodes configured to generate electric fields for deflecting the charged particles; applying a scanning voltage to each of the plurality of scanning electrodes based on each of the set plurality of scanning voltages; and causing an electrostatic lens, which is provided between the plurality of scanning electrodes and a sample table, to focus the charged particles deflected by the plurality of scanning voltages.

According to at least one aspect of the present invention, in the charged particle beam apparatus including the electrostatic lens, for example, an objective lens OL, and the two-stage scanning electrodes installed in the previous stage of the electrostatic lens, when the objective lens is switched between the acceleration mode and the deceleration mode, or the application voltage of the booster electrode that forms the objective lens is changed, it is possible to obtain a scanned image of a sample surface without any distortion and with a precise dimension at the same level as an image before the switching or the change.

DESCRIPTION OF THE EMBODIMENTS

Next, a charged particle beam apparatus, a composite charged particle beam apparatus, and a control method for a charged particle beam apparatus according to embodiments of the present invention are described with reference to the drawings. The following embodiments are described merely as an example, and the present invention can be applied to any embodiment without limiting to the following embodiments.

Throughout the drawings for illustrating the embodiments, components having the same function are denoted by identical reference symbols, and a duplicate description thereof is omitted.

The description "based on XX" as used herein means "based on at least XX," and encompasses "based on another element in addition to XX." Further, the description "based on XX" is not limited to a case of directly using "XX" but encompasses a case of being "based on a result of calculating or processing XX." The term "XX" refers to a freely selected element (for example, freely selected information).

First Embodiment

Figure 1:
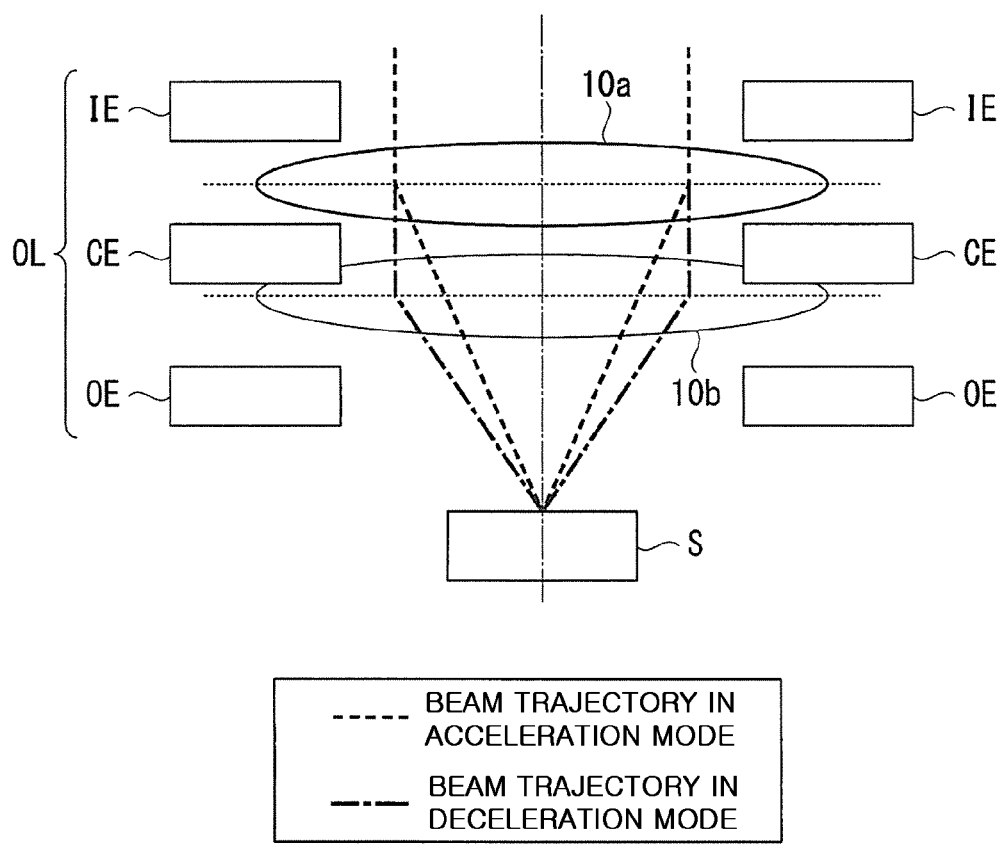
FIG. 1 is a schematic view for illustrating how a principal surface of an objective lens moves when the objective lens is switched between an acceleration mode and a deceleration mode.
Figure 2:
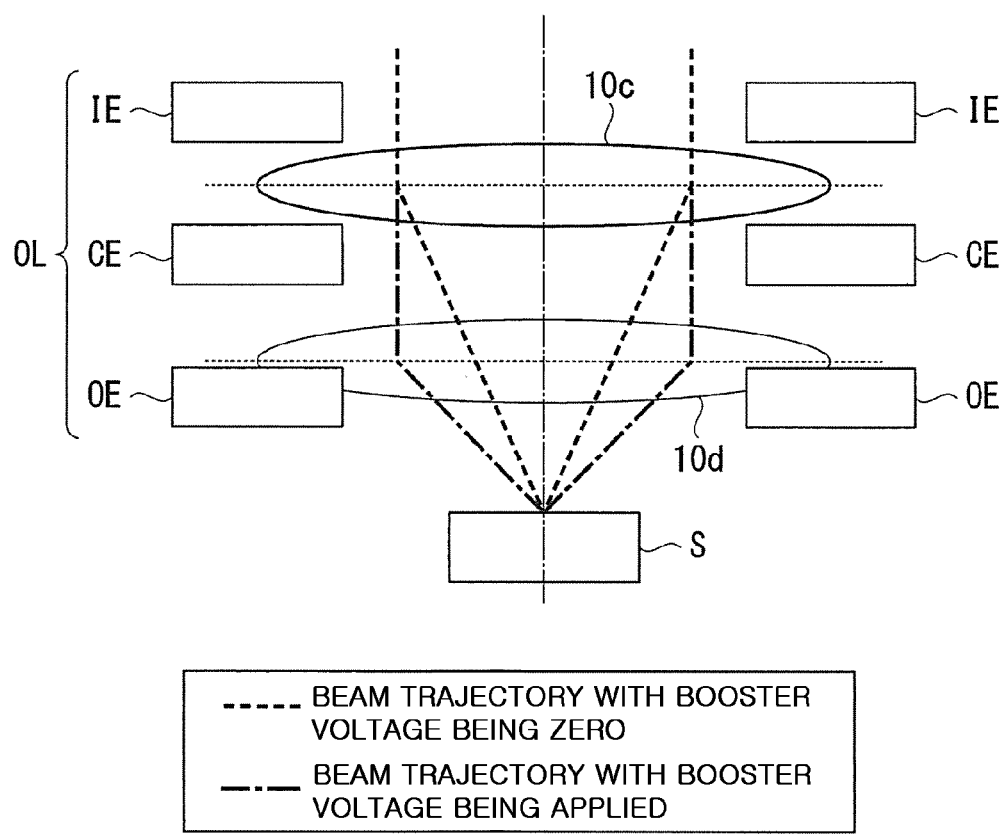
FIG. 2 is a schematic view for illustrating how the principal surface of the objective lens moves when a booster voltage is applied.
Figure 3:
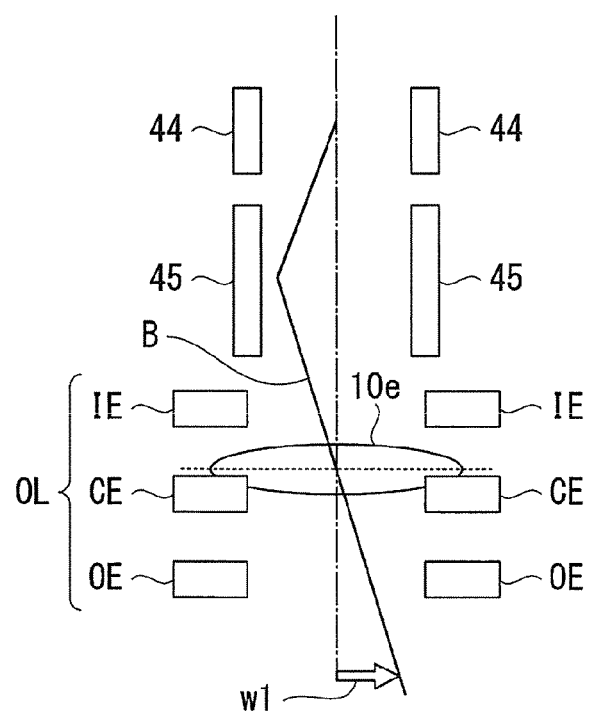
FIG. 3 is a view for illustrating Example 1 of beam scanning with two-stage scanning electrodes.
Figure 4:
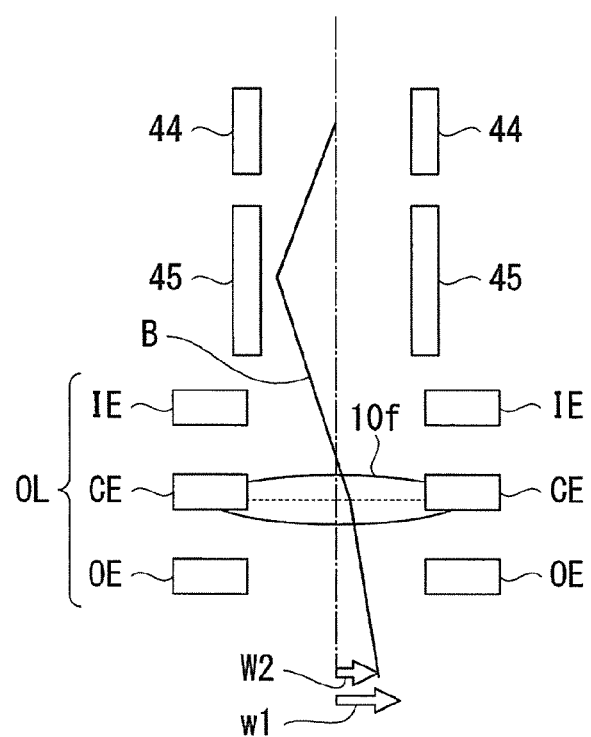
FIG. 4 is a view for illustrating Example 2 of beam scanning with the two-stage scanning electrodes.
Figure 5:
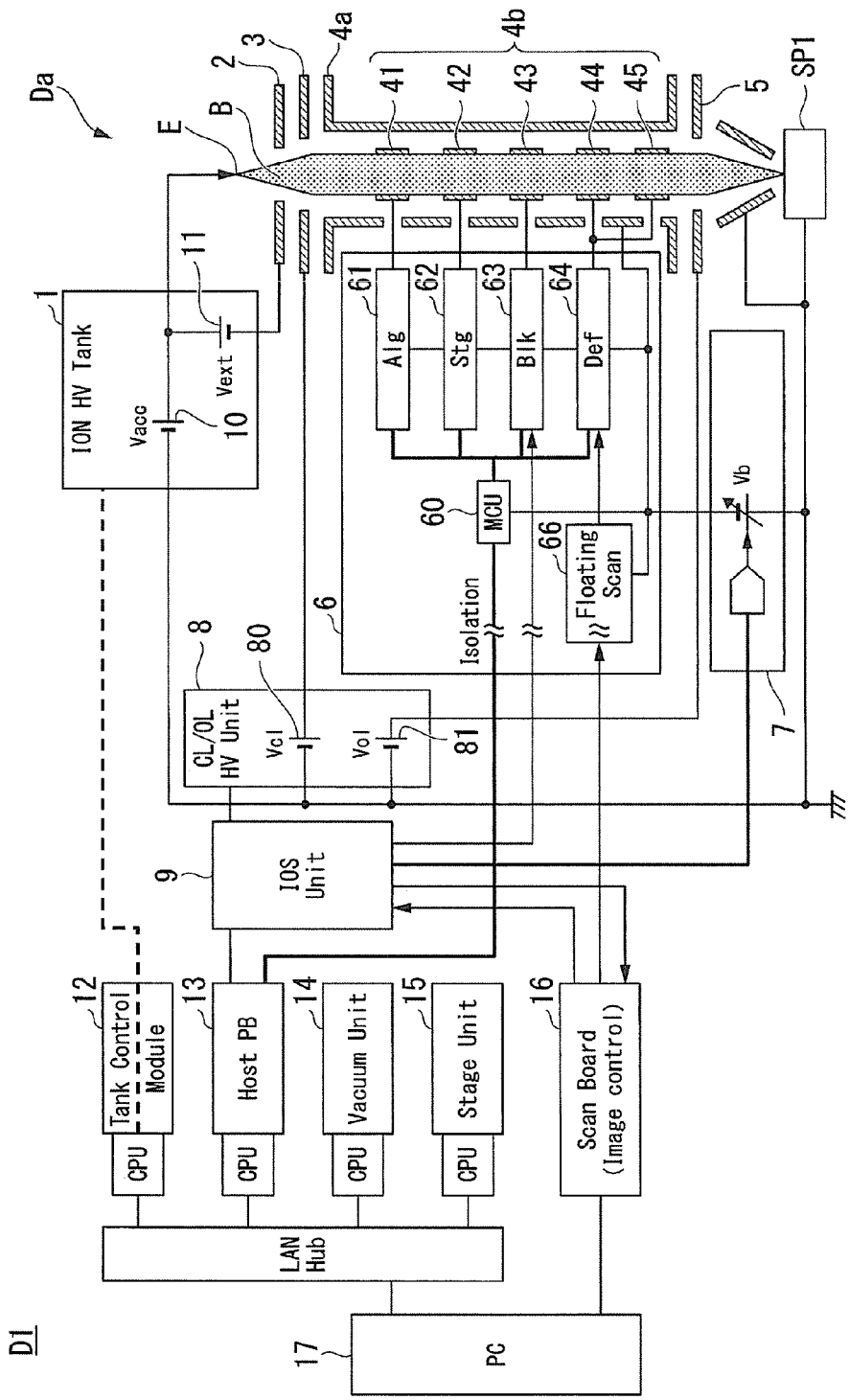
FIG. 5 is a diagram for illustrating a configuration example of a charged particle beam apparatus according to a first embodiment of the present invention.

FIG. 5 is a diagram for illustrating a configuration example of a charged particle beam apparatus according to a first embodiment of the present invention.

A charged particle beam apparatus D1 includes a charged particle beam apparatus main body (focused ion beam apparatus main body) Da, a beam booster control unit 6, a beam booster power supply unit 7, a lens power supply unit 8, a control unit 9, a tank control module 12, a host PB unit 13, a vacuum control unit 14, a stage control unit 15, a scan board 16, and a personal computer (PC) 17.

The focused ion beam apparatus main body Da includes an ion source control unit 1, an ion emitter E, an extraction electrode 2, a condenser lens center electrode 3, a booster tube 4a, and an objective lens center electrode 5. The focused ion beam apparatus main body Da is configured to accelerate an ion beam B to an acceleration voltage Vacc, and then focus the ion beam B through a condenser lens formed by an electric field generated among the condenser lens center electrode 3, the extraction electrode 2, and the booster tube 4a, and an objective lens formed by an electric field generated among the objective lens center electrode 5, the booster tube, and a ground electrode, so as to irradiate a sample SP1 on a sample table with the ion beam B. The sample SP1 is placed in a grounded state.

The ion source control unit 1 is configured to control emission of a charged particle beam. An example of the charged particle beam is the ion beam B. The following description is given of a case in which the ion beam B is adopted as the charged particle beam. The ion source control unit 1 includes an extraction power supply 11, and an acceleration power supply 10.

The ion emitter E is a charged particle source configured to generate charged particles. The ion emitter E is assumed to be a liquid metal ion source including metal with a sharp tip end that is wetted with liquid metal gallium, for example. As another example, the ion emitter E may be a gas field ion source that is supplied with helium, neon, oxygen, nitrogen, hydrogen, or other such gas in place of the liquid metal. As still another example, the ion emitter E may adopt an inductively coupled plasma ion source, an electron cyclotron resonance plasma ion source, or a Penning ion gauge (PIG) plasma ion source for its charged particle supply portion.

The extraction power supply 11 is configured to apply an extraction voltage Vext between the tip end of the ion emitter E and the extraction electrode 2, to thereby extract gallium ions as charged particles from the tip end of the ion emitter E.

The acceleration power supply 10 is configured to apply an acceleration voltage Vacc to the charged particles generated by the ion emitter E, to thereby produce the ion beam B and accelerate the produced ion beam B. The acceleration voltage Vacc is, by way of example, 30 kV at most. However, in order to minimize damage that may be applied to the sample by irradiation with the ion beam, the acceleration voltage may be set and used in each processing step with the focused ion beam. For example, the acceleration voltage may be set to 30 kV for rough processing, and for finishing processing, the acceleration voltage may be set to a lower value than in the rough processing, for example, 1 kV or 0.5 kV.

The condenser lens including the condenser lens center electrode 3 is configured to focus the ion beam B that has been accelerated by the acceleration power supply 10 applying the acceleration voltage Vacc. In this example, the condenser lens is configured to focus the passing ion beam B with an electric field that is generated through application of a condenser lens voltage Vcl to the condenser lens center electrode 3 by a condenser lens power supply 80 of the lens power supply unit 8.

The booster tube 4a is configured to apply a beam booster voltage Vb to the ion beam B focused by the condenser lens. The booster tube 4a is provided between the condenser lens center electrode 3 and the objective lens center electrode 5. The booster tube 4a is configured to increase potential energy of the ion beam B having passed through the condenser lens, to thereby suppress an increase in amount of beam blur caused by chromatic aberration or expansion of a beam profile caused by the Coulomb interaction. The booster tube 4a includes a beam booster 4b. Here, the beam booster 4b is an example of a beam booster voltage application unit. The beam booster 4b includes an alignment electrode 41, an astigmatism correction electrode 42, a blanking electrode 43, a first scanning electrode 44, and a second scanning electrode 45.

The alignment electrode 41 is provided between the condenser lens center electrode 3 and the astigmatism correction electrode 42. The alignment electrode 41 is connected to an alignment power supply 61 of the beam booster control unit 6. The alignment electrode 41 is configured to apply a voltage to the ion beam B, to thereby correct deviation of an optical axis of the passing ion beam B.

The astigmatism correction electrode 42 is provided between the alignment electrode 41 and the blanking electrode 43. The astigmatism correction electrode 42 is connected to an astigmatism correction power supply 62 of the beam booster control unit 6. The astigmatism correction electrode 42 is configured to apply a voltage to the ion beam B, to thereby correct distortion of a sectional shape of the passing ion beam B into perfect circle.

The blanking electrode 43 is provided between the astigmatism correction electrode 42 and the first scanning electrode 44. The blanking electrode 43 is connected to a blanking power supply 63 of the beam booster control unit 6. The blanking electrode 43 is configured to apply a voltage to the ion beam B, to thereby deflect the passing ion beam B so as not to irradiate the sample SP1 with the ion beam B.

The first scanning electrode 44 is provided between the blanking electrode 43 and the second scanning electrode 45. The first scanning electrode 44 is connected to a deflection power supply 64 of the beam booster control unit 6. The first scanning electrode 44 is configured to apply a voltage to the ion beam B, to thereby scan the passing ion beam B on the sample SP1.

The second scanning electrode 45 is provided between the first scanning electrode 44 and the objective lens center electrode 5. The second scanning electrode 45 is connected to the deflection power supply 64 of the beam booster control unit 6. The second scanning electrode 45 is configured to apply a voltage to the ion beam B, to thereby scan the passing ion beam B on the sample SP1.

The objective lens center electrode 5 is provided between the second scanning electrode 45 and the sample table. The objective lens is configured to focus the ion beam B that has been applied with the beam booster voltage Vb by the beam booster 4b so as to irradiate the sample SP1 with the focused ion beam B. In this example, the objective lens is configured to focus the passing ion beam B with an electric field that is generated through application of an objective lens voltage Vol to the objective lens center electrode 5 by an objective lens power supply 81 included in the lens power supply unit 8. Further, the objective lens is configured to decelerate the ion beam B by an amount corresponding to a potential difference of the beam booster.

The beam booster control unit 6 is configured to control the beam booster 4b. The beam booster control unit 6 includes a memory control unit (MCU) 60, the alignment power supply 61, the astigmatism correction power supply 62, the blanking power supply 63, the deflection power supply 64, and a high-voltage floating unit 66.

The MCU 60 is configured to control, based on the beam booster voltage Vb set by the beam booster power supply unit 7, the alignment power supply 61, the astigmatism correction power supply 62, and the blanking power supply 63. The MCU 60 is configured to control the deflection power supply 64 based on a first voltage value EdefU and a second voltage value EdefL, which are set by the control unit 9. The first voltage value EdefU is a value of a first voltage VdefU that is to be applied to the first scanning electrode 44. The second voltage value EdefL is a value of a second voltage VdefL that is to be applied to the second scanning electrode 45.

The alignment power supply 61 is configured to apply a voltage to the alignment electrode 41. The astigmatism correction power supply 62 is configured to apply a voltage to the astigmatism correction electrode 42. The blanking power supply 63 is configured to apply a voltage to the blanking electrode 43. The deflection power supply 64 is configured to apply a voltage to the first scanning electrode 44 and the second scanning electrode 45.

The high-voltage floating unit 66 is configured to supply a scanning signal to the deflection power supply 64 under control of the scan board 16. The scanning signal is a signal for adjusting an irradiation position of the ion beam B on the sample SP1. The high-voltage floating unit 66 forms a scanning system SS together with the scan board 16.

The beam booster power supply unit 7 is configured to set the beam booster voltage Vb based on the control by the control unit 9.

The lens power supply unit 8 includes the condenser lens power supply 80 and the objective lens power supply 81. The condenser lens power supply 80 is configured to apply a voltage to the condenser lens center electrode 3. The objective lens power supply 81 is configured to apply a voltage to the objective lens center electrode 5.

The control unit 9 is configured to control the beam booster power supply unit 7 based on an acceleration voltage value Eacc of the acceleration voltage Vacc supplied from the PC 17. In this example, the acceleration voltage value Eacc is supplied to the control unit 9 from the PC 17 via the host PB unit 13. The control unit 9 is described below in detail.

The PC 17 is configured to receive various operations from a user of the charged particle beam apparatus D1. The PC 17 is configured to supply an operation signal to the ion source control unit 1 via the tank control module 12. The PC 17 is configured to supply an operation signal to the beam booster control unit 6 and the control unit 9 via the host PB unit 13. Here, the operation signal includes, for example, information indicating the acceleration voltage value Eacc being a value of the acceleration voltage Vacc. The PC 17 is also configured to control the vacuum control unit 14 configured to control a vacuum condition of the charged particle beam apparatus D1, and the stage control unit 15 configured to control a stage on which the sample SP1 is to be placed.

In the first embodiment, description is given, by way of example, of a case in which the beam booster voltage Vb set by the beam booster power supply unit 7 is zero.

The alignment electrode 41, the astigmatism correction electrode 42, and the blanking electrode 43 included in the beam booster 4b may be omitted. Further, the alignment power supply 61, the astigmatism correction power supply 62, and the blanking power supply 63 included in the beam booster control unit 6 may be omitted. The beam booster power supply unit 7 may be omitted.

Next, the configuration of the control unit 9 is described in detail.

Figure 6:
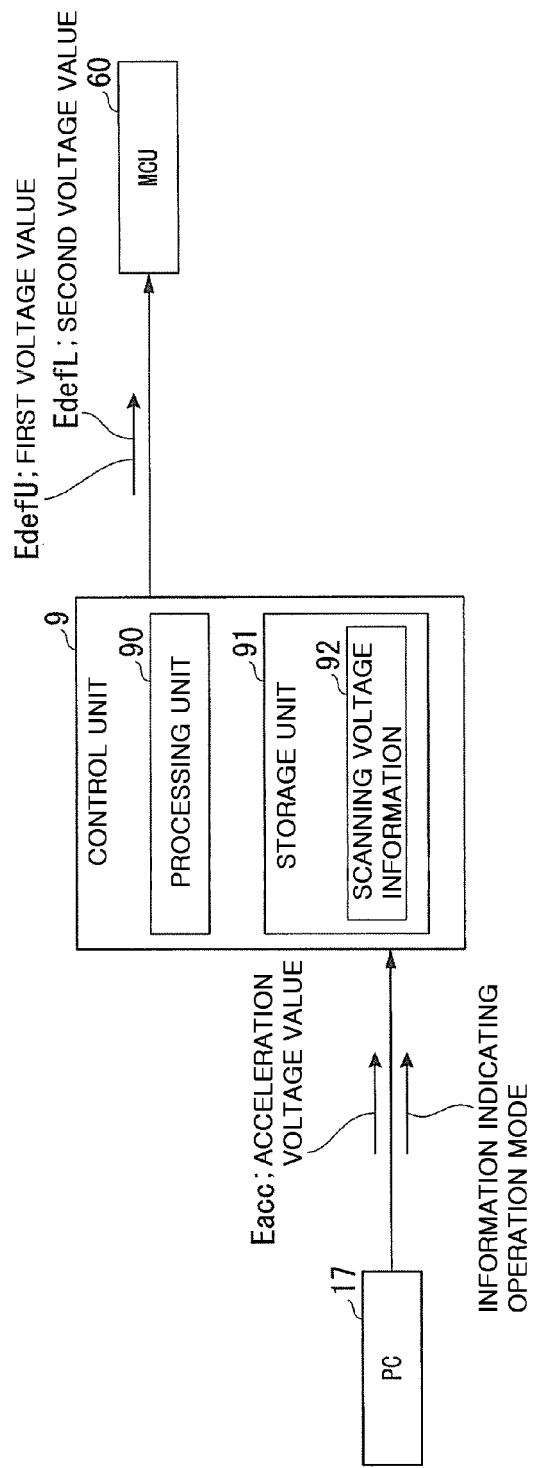
FIG. 6 is a diagram for illustrating a configuration example of a control unit in the charged particle beam apparatus according to the first embodiment.

FIG. 6 is a diagram for illustrating a configuration example of the control unit in the charged particle beam apparatus according to the first embodiment. The control unit 9 includes a processing unit 90 and a storage unit 91. In the storage unit 91, scanning voltage information 92 is stored.

The processing unit 90 is configured to derive the first voltage value EdefU being a value of the first voltage VdefU and the second voltage value EdefL being a value of the second voltage VdefL, from the acceleration voltage value Eacc and information indicating an operation mode supplied from the PC 17, and the scanning voltage information 92 read from the storage unit 91. The processing unit 90 is configured to output the derived first voltage value EdefU and second voltage value EdefL to the MCU 60.

In the scanning voltage information 92, there are stored, for each acceleration voltage value Eacc being a value of the acceleration voltage Vacc, an operation mode and information that specifies the first voltage value EdefU being a value of the first voltage VdefU and the second voltage value EdefL being a value of the second voltage VdefL, in association with each other.

Figures 7, 8:
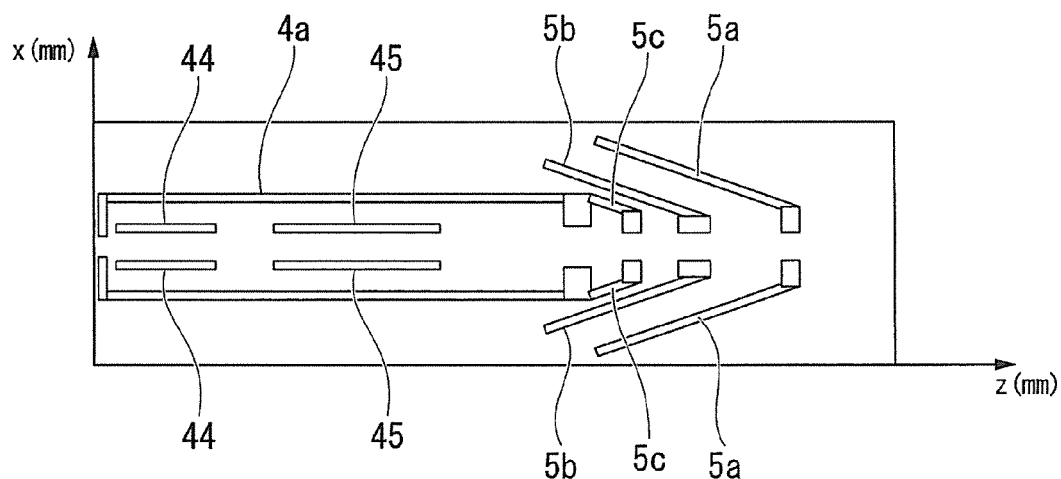
FIG. 7 is a diagram for illustrating an example of scanning voltage information.
FIG. 8 is a view for illustrating an example of a first electrode, a second electrode, an incident side electrode, an intermediate electrode, and an exit side electrode in the charged particle beam apparatus according to the first embodiment.

FIG. 7 is a diagram for illustrating an example of the scanning voltage information. In the example shown in FIG. 7, in the scanning voltage information 92, the operation mode, a ratio between the first voltage value EdefU and the second voltage value EdefL, and the first voltage value EdefU are associated with one another for each of the acceleration voltage values Eacc of 5 kV, 10 kV, and 30 kV. In this case, the operation mode includes an acceleration mode and a deceleration mode.

The acceleration mode is an operation mode for accelerating the ion beam B to a higher level than before the ion beam enters the objective lens, and focusing the ion beam in the objective lens. The deceleration mode is an operation mode for decelerating the ion beam B to a lower level than before the ion beam enters the objective lens, and focusing the ion beam in the objective lens. In both modes, at the time of exiting the objective lens, the ion beam is at the same speed as when the ion beam enters the objective lens. As shown in FIG. 7, in the scanning voltage information 92, there are associated: the acceleration voltage value of "30 kV," the operation mode of "acceleration mode," and the ratio of "1:0.953" between the first voltage value and the second voltage value, and the first voltage value of "210 V"; and the acceleration voltage value of "30 kV," the operation mode of "deceleration mode," the ratio of "1:0.942" between the first voltage value and the second voltage value, and the first voltage value of "228 V." In this case, the acceleration voltage values Eacc of 5 kV, 10 kV, and 30 kV are shown as an example, but the present invention is not limited to this example. The acceleration voltage value Eacc may be any value in addition to 5 kV, 10 kV, and 30 kV. Further, the first voltage value is a value that ensures a particular scanning width on the sample, and is, for example, a value for scanning with a 0.5 mm width.

Here, description is given of processing for causing the ion beam B to pass through the principal surface of the objective lens on the optical axis.

FIG. 8 is a view for illustrating an example of the first scanning electrode, the second scanning electrode, and an incident side electrode, an intermediate electrode, and an exit side electrode that form the objective lens in the charged particle beam apparatus according to the first embodiment. In FIG. 8, there are illustrated the booster tube 4a, the first scanning electrode 44, the second scanning electrode 45, an incident side electrode 5c, an intermediate electrode 5b, and an exit side electrode 5a. In FIG. 8, a transverse direction of the booster tube 4a is defined as an X axis, and a longitudinal direction of the booster tube 4a is defined as a Z axis. Further, a direction on the Z axis from a side from which the ion beam B enters the lens to a side from which the ion beam B exits the lens is defined as a positive direction.

Next, the trajectory of the ion beam B is described.

Figure 9:
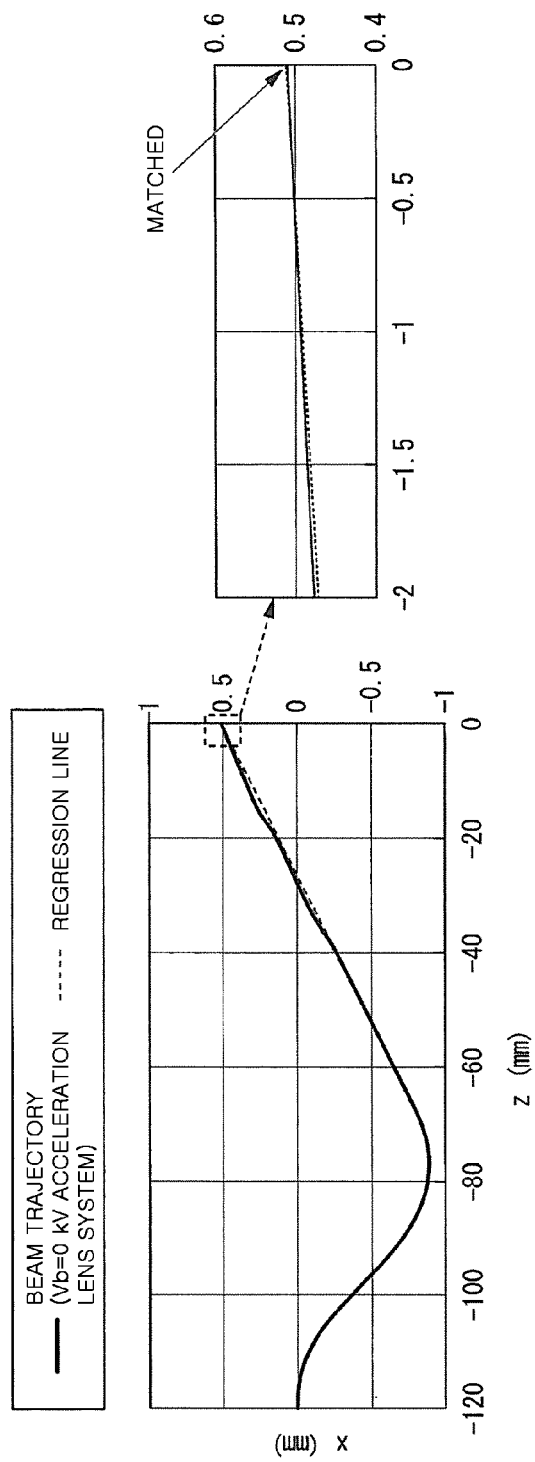
FIG. 9 shows graphs of an example of an ion beam trajectory in the configuration of FIG. 8.

FIG. 9 shows graphs of an example of the ion beam trajectory in the configuration of FIG. 8. In FIG. 9, an X axis and a Z axis are as illustrated in FIG. 8. FIG. 9 shows a case in which the operation mode is the acceleration mode (acceleration lens system), the acceleration voltage is 5 kV, and the beam booster 4b is not provided (beam booster voltage value is 0 V). Although not shown in FIG. 9, there are formed a deflection electric field generated by the first scanning electrode in a region of a Z axis value of from −120 mm to −110 mm, a deflection electric field generated by the second scanning electrode in a region of the Z axis value of from −90 mm to −70 mm, and a focused electric field generated by the objective lens in a region of the Z axis value of from −40 mm to −5 mm. FIG. 9 shows the trajectory of the ion beam B from when the ion beam B enters the first scanning electrode until when the ion beam B reaches the sample surface, and a result of fitting a regression line to the trajectory of the ion beam B.

As can be understood from the left-hand graph of FIG. 9, the trajectory of the ion beam B and the result of fitting the regression line to the trajectory of the ion beam B cross each other at an image plane.

The right-hand graph of FIG. 9 is an enlarged graph of a portion of the left-hand graph of FIG. 9, which shows the trajectory of the ion beam B and the result of fitting the regression line to the trajectory of the ion beam B at Z=0 mm. As shown in the right-hand graph of FIG. 9, when the Z axis value (with respect to sample surface) Z is 0 mm, X is 0.5 mm. The ion beam B can be considered to have the straight trajectory while passing through the focused electric field generated by the objective lens in a region of a Z axis coordinate of from −40 mm to −5 mm. Thus, the ion beam B reaches the sample surface with little influence of a lens action of the objective lens.

The beam passing through the principal surface of the lens on the optical axis travels straight and hence, it can be considered that the trajectory of the ion beam B of FIG. 9 passes through the principal surface of the objective lens. At this time, a ratio (DEF ratio between upper stage and lower stage) between the first voltage value EdefH and the second voltage value EdefL (first voltage value EdefH:second voltage value EdefL) is 1:0.953.

Assuming that the first voltage value EdefH is 35 V, and the second voltage value EdefL is −33.36 V, the amplitude in the X axis direction of the trajectory of the ion beam B is 0.5 mm. It should be noted here that polarities of the first voltage value and the second voltage value are required to be inverted.

Further, although not shown, also in a Y axis direction being a vertical direction to the drawing sheet, scanning can be performed by applying the first voltage value and the second voltage value to the first scanning electrode and the second scanning electrode, respectively, as with the X axis. An XY plane can be scanned through raster scanning. When the polarities of the first voltage value and the second voltage value are inverted, scanning is performed in an opposite direction on each axis.

With the first voltage value EdefH of 35 V, and the second voltage value EdefL of −33.36 V, the sample surface is scanned by +0.5 mm.

With the first voltage value EdefH of −35 V, and the second voltage value EdefL of 33.36 V, the sample surface is scanned by −0.5 mm.

In the above-mentioned example, the scanning is performed in a region of ±0.5 mm, that is, 1 mm$^2$.

The ion beam trajectory was derived also for a case in which the operation mode is the deceleration mode, the acceleration voltage value Eacc is 5 kV, and the beam booster 4b is not provided (beam booster voltage value is 0 V). It was found that when the ratio (DEF ratio between upper stage and lower stage) between the first voltage value EdefH and the second voltage value EdefL (first voltage value EdefH:second voltage value EdefL) is 1:0.942, the trajectory matches the regression line on the sample surface. In order to achieve the amplitude of 0.5 mm (field of view of scanned image: 1 mm$^2$) for the trajectory of the ion beam B in the X axis direction, the first voltage value EdefH is set to 38 V.

The scanning voltage information 92 of FIG. 7 is derived from the above-mentioned values.

Next, description is given of processing for setting the first voltage value EdefU and the second voltage value EdefL based on the acceleration voltage and the operation mode in relation to the operation of the charged particle beam apparatus.

Figure 10:
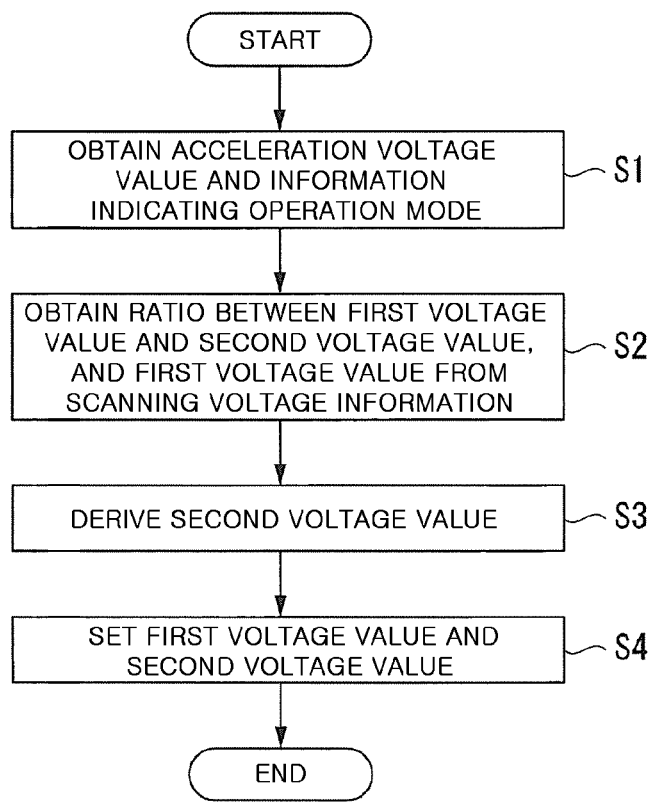
FIG. 10 is a flow chart for illustrating an operation example of the charged particle beam apparatus according to the first embodiment.

FIG. 10 is a flow chart for illustrating an operation example of the charged particle beam apparatus according to the first embodiment.

(Step S1)

In the charged particle beam apparatus D1, the processing unit 90 obtains from the PC 17 the acceleration voltage value Eacc and information indicating the operation mode.

(Step S2)

In the charged particle beam apparatus D1, the processing unit 90 reads out the scanning voltage information 92 from the storage unit 91. The processing unit 90 obtains, from the read scanning voltage information 92, a ratio between the first voltage value and the second voltage value, and a first voltage value, which are associated with a combination of the obtained acceleration voltage value Eacc and the obtained information indicating the operation mode.

(Step S3)

In the charged particle beam apparatus D1, the processing unit 90 derives a second voltage value based on the obtained ratio between the first voltage value and the second voltage value, and the obtained first voltage value.

(Step S4)

In the charged particle beam apparatus D1, the processing unit 90 sets the first voltage value and the derived second voltage value in the MCU 60. It should be noted here that the polarities of the first voltage value and the second voltage value are required to be inverted.

Further, the first voltage value is a value that ensures a particular scanning width on the sample and, for example, is a value for scanning with a 0.5 mm width. Further, when the polarities of the first voltage value and the second voltage value are inverted, scanning is performed in an opposite direction.

In and after Step S4, the scanning width can be changed to any value. For example, in a case of scanning with a 0.1 mm width, it is only required to reduce the first voltage value and the second voltage value to ⅕. The first voltage value and the second voltage value are changed based on the ratio between the first voltage value and the second voltage value, and hence a precise scanned image with no distortion can be obtained.

The foregoing description of the first embodiment is given of the case in which, in the scanning voltage information 92, the acceleration voltage value, the information indicating the operation mode, the information indicating the ratio between the first voltage value and the second voltage value, and the first voltage value are stored in association with one another. However, the present invention is not limited to this example. For example, in the scanning voltage information 92, the acceleration voltage value, the information indicating the operation mode, the information indicating the ratio between the first voltage value and the second voltage value, and the second voltage value may be stored in association with one another. Alternatively, in the scanning voltage information 92, the acceleration voltage value, the information indicating the operation mode, the first voltage value, and the second voltage value may be stored in association with one another.

The foregoing description of the first embodiment is given of the case in which the control unit 9 includes the storage unit 91, but the present invention is not limited to this example. For example, the storage unit 91 may be provided outside the charged particle beam apparatus D1. When the storage unit 91 is provided outside the charged particle beam apparatus D1, for example, the storage unit 91 may be provided as an external storage device or a cloud server as well.

Further, instead of storing the scanning voltage information 92 in the storage unit 91, the storage unit 91 may store therein calculation expressions for deriving the first scanning voltage VdefU and the second scanning voltage VdefL based on the acceleration voltage value Eacc and the information indicating the operation mode. In this case, the control unit 9 may derive and set the first scanning voltage VdefU and the second scanning voltage VdefL based on the calculation expressions.

In the first embodiment described above, the information included in the scanning voltage information 92 may be partially omitted. For example, such information that the acceleration voltage is 5 kV and the operation mode is the deceleration mode is rarely used and hence can be omitted. In contrast, any information can be added to the scanning voltage information 92.

The charged particle beam apparatus D1 according to the first embodiment includes: a charged particle source (in the first embodiment, ion emitter E) configured to generate charged particles; a plurality of scanning electrodes configured to generate electric fields for deflecting charged particles that are emitted by applying an acceleration voltage to the charged particle source and applying an extraction voltage to an extraction electrode configured to extract the charged particles; an electrostatic lens (in the first embodiment, objective lens), which is provided between the plurality of scanning electrodes and a sample table, and is configured to focus a charged particle beam scanned with a scanning voltage; and a processing unit configured to obtain measurement conditions (in this case, acceleration voltage value Eacc and operation mode) and set each of a plurality of scanning voltages based on the obtained measurement conditions.

With this configuration, in the charged particle beam apparatus including the electrostatic lens, for example, the objective lens OL, and the two-stage scanning electrodes installed in the previous stage of the electrostatic lens, when the objective lens is switched between the acceleration mode and the deceleration mode, the scanned image of the sample surface can be obtained without any distortion and with a precise dimension at the same level as an image before the switching. Further, even when a measurement condition is changed, and then the principal surface position of the electrostatic lens is changed, each of the plurality of scanning voltages can be set based on the changed measurement condition (in this case, operation mode), and hence the trajectory of the ion beam B can be changed. Thus, the lens action that may be exerted on the scanned beam can be reduced.

Modification Example 1 of First Embodiment

The configuration of FIG. 5 can be applied to the configuration of a charged particle beam apparatus according to Modification Example 1 of the first embodiment. The charged particle beam apparatus according to Modification Example 1 of the first embodiment differs from the charged particle beam apparatus D1 according to the first embodiment in that the beam booster voltage Vb is applied to the ion beam B. That is, in the configuration of the charged particle beam apparatus described with reference to FIG. 5, the alignment electrode 41, the astigmatism correction electrode 42, and the blanking electrode 43 included in the beam booster 4b are not omitted. Further, the alignment power supply 61, the astigmatism correction power supply 62, and the blanking power supply 63 included in the beam booster control unit 6 are not omitted. The beam booster power supply unit 7 is not omitted. It should be noted that in the charged particle beam apparatus according to Modification Example 1 of the first embodiment, the operation mode is not changed. The charged particle beam apparatus according to Modification Example 1 of the first embodiment includes a control unit 9a in place of the control unit 9.

The configuration of the control unit 9a is described in detail.

Figure 11:
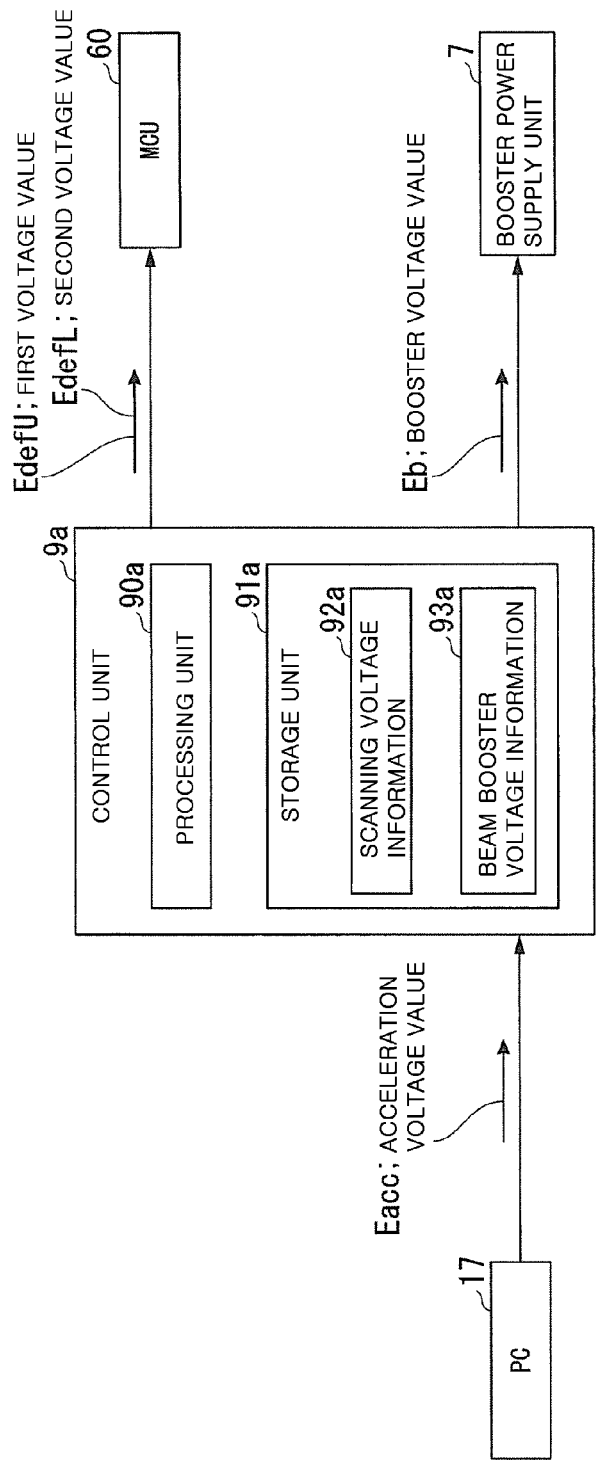
FIG. 11 is a diagram for illustrating a configuration example of a control unit in a charged particle beam apparatus according to Modification Example 1 of the first embodiment.

FIG. 11 is a diagram for illustrating a configuration example of the control unit in the charged particle beam apparatus according to Modification Example 1 of the first embodiment. The control unit 9a includes a processing unit 90a and a storage unit 91a. In the storage unit 91a, scanning voltage information 92a and beam booster voltage information 93a are stored.

The processing unit 90a is configured to derive a beam booster voltage value Eb being a value of the beam booster voltage Vb based on the acceleration voltage value Eacc supplied from the PC 17 and the beam booster voltage information 93a read out from the storage unit 91a. The processing unit 90a is configured to supply the calculated beam booster voltage value Eb to the beam booster power supply unit 7.

The processing unit 90a is configured to derive the first voltage value EdefU being a value of the first voltage VdefU and the second voltage value EdefL being a value of the second voltage VdefL based on the acceleration voltage value Eacc supplied from the PC 17 and the derived beam booster voltage value Eb. The processing unit 90a is configured to output the derived first voltage value EdefU and second voltage value EdefL to the MCU 60.

The scanning voltage information 92a is information having a table format in which the acceleration voltage value Eacc, the beam booster voltage value Eb, information indicating a ratio between the first voltage value EdefU and the second voltage value EdefL, and the first voltage value EdefU are associated with one another.

Figures 12, 13:
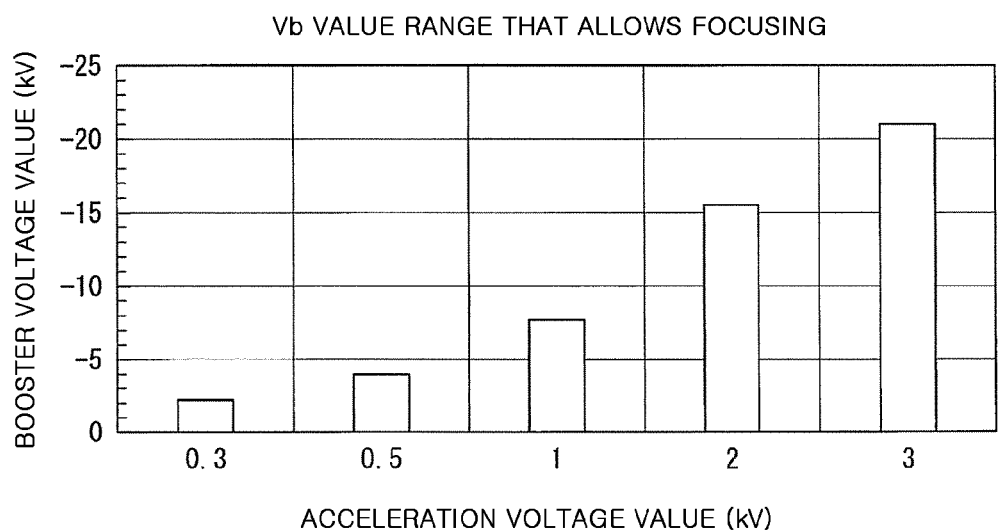
FIG. 12 is a diagram for illustrating an example of scanning voltage information.
FIG. 13 is a graph for showing an example of a relationship between an acceleration voltage value Eacc and a range of a beam booster voltage value Eb in the charged particle beam apparatus according to Modification Example 1 of the first embodiment.

FIG. 12 is a diagram for illustrating an example of scanning voltage information. In the example shown in FIG. 12, in the scanning voltage information 92a, information indicating the operation mode and information indicating the principal surface position are associated with one another in addition to the acceleration voltage value Eacc (kV), the beam booster voltage value Eb (kV), the information indicating a ratio between the first voltage value EdefU and the second voltage value EdefL, and the first voltage value EdefU (V). In this example, the principal surface position is a Z-axis position of the principal surface. As shown in FIG. 12, in the scanning voltage information 92a, the acceleration voltage value of "30 kV," the operation mode of "deceleration mode," the beam booster voltage value of "0 kV," the principal surface position of "−24.6 mm," the ratio of "1:0.942" between the first voltage and the second voltage, and the first voltage of "228 V" are associated with one another. Further, in the scanning voltage information 92a, the acceleration voltage value of "1 kV," the operation mode of "acceleration mode," the beam booster voltage value of "−5 kV," the principal surface position of "−29.0 mm," the ratio of "1:0.986" between the first voltage and the second voltage, and the first voltage of "35.5 V" are associated with one another. Further, in the scanning voltage information 92a, the acceleration voltage value of "5 kV," the operation mode of "acceleration mode," the beam booster voltage value of "−5 kV," the principal surface position of "−23.7 mm," the ratio of "1:0.937" between the first voltage and the second voltage, and the first voltage of "80 V" are associated with one another. In FIG. 12, the principal surface position may be omitted out of the information included in the scanning voltage information 92a.

The beam booster voltage information 93a is set for each acceleration voltage value Eacc. Assuming that the focused ion beam and the electron beam are used to form a composite charged particle beam apparatus, the booster voltage value is limited for each acceleration voltage in order to focus the beams at a cross point (coincidence point) between the two beams (focused ion beam and electron beam). An example thereof is shown in FIG. 13. FIG. 13 shows a relationship between the acceleration voltage value (kV) and the booster voltage value (kV). As the acceleration voltage is decreased, the booster voltage value is decreased. In a case of a single-beam apparatus, the above-mentioned limitation is not imposed.

The processing unit 90a is configured to, when the acceleration voltage value Eacc of the acceleration voltage Vacc is switched, change the beam booster voltage value Eb to a voltage value that is equal to or less than a beam booster voltage set value TEb indicated by the beam booster voltage information 93a. In the beam booster voltage information 93a, an upper limit of the beam booster voltage Vb is stored. After setting the beam booster voltage value Eb, the processing unit 90a may store the acceleration voltage value Eacc and the set beam booster voltage value Eb in association with each other in the beam booster voltage information 93a. The next time the processing unit 90a sets the beam booster voltage Vb, the processing unit 90a may derive the beam booster voltage value Eb based on the beam booster voltage value Eb stored in association with the acceleration voltage value Eacc.

Next, the trajectory of the ion beam B is described.

Figure 14:
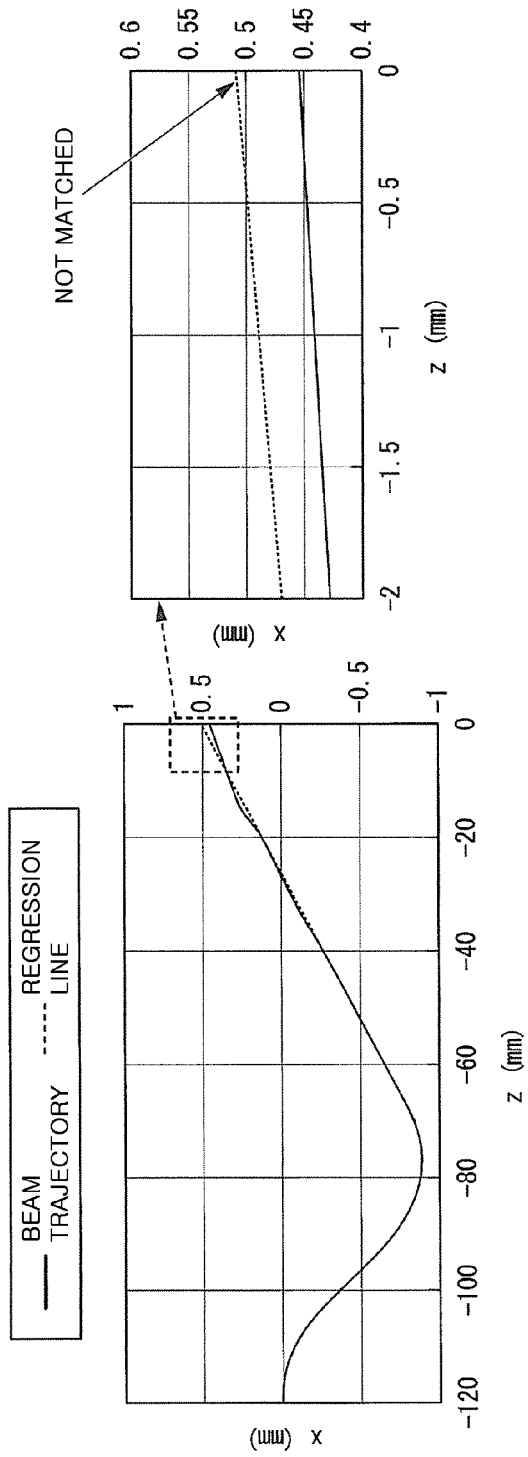
FIG. 14 shows graphs of an example of an ion beam trajectory.

FIG. 14 shows graphs of an example of the ion beam trajectory. In FIG. 14, an X axis and a Z axis are as illustrated in FIG. 8. FIG. 14 shows a case in which the acceleration voltage value Eacc is 5 kV and the beam booster voltage value Eb is 5 kV. The beam booster voltage value Eb is 5 kV, and hence the acceleration energy of the ion beam in the booster tube is 10 keV. The scanning voltage is set twice higher than a value obtained when the beam booster voltage is 0 kV. In this example, it is assumed, by way of example, that the first scanning voltage value EdefU is 70 V, and the second scanning voltage value EdefL is 66.71 V. In this case, the ratio of "first scanning voltage value EdefU:second scanning voltage value EdefL" is 1:0.953. This ratio gives such a trajectory along which the ion beam B can be considered to pass through the principal surface of the objective lens when the beam booster voltage is 0 kV.

FIG. 14 shows the trajectory of the ion beam B from when the ion beam B enters the first scanning electrode until when the ion beam B reaches the sample surface, and a result of fitting a regression line to the trajectory of the ion beam B as in FIG. 9.

As shown in the left-hand graph of FIG. 14, the trajectory of the ion beam B and the result of fitting the regression line to the trajectory of the ion beam B do not match each other on an image plane. This is supposedly because the ion beam B undergoes the lens action in the electric field of the objective lens and thus deviates from the linear trajectory. Although the beam passing through the principal surface of the lens on the optical axis travels straight, the ion beam B deviates from the linear trajectory in this example, and hence it is considered that the ion beam B does not pass through the principal surface of the objective lens. This suggests that when the beam booster voltage Vb is changed, the deviation of the principal surface position occurs.

The right-hand graph of FIG. 14 is an enlarged graph of a portion of the left-hand graph of FIG. 14, which shows the trajectory of the ion beam B and a result of fitting a regression line to the trajectory of the ion beam B at Z=0 mm. As shown in the right-hand graph of FIG. 14, in the trajectory of the ion beam B, when the Z axis value (with respect to sample surface) Z is 0 mm, X is 0.45 mm. That is, the amplitude in the X axis direction of the trajectory of the ion beam B is smaller than 0.5 mm. This is supposedly due to de-scanning by the lens action. That is, in this case, it is suggested that the scanning width is 10% short due to the lens action, and the measurement of the dimension of the scanned image results in an inaccurate value.

In Modification Example 1 of the first embodiment, in order to reduce the influence of a lens action resulting from deviation of the principal surface position caused by changing the booster voltage Vb, the scanning voltage value Edef is adjusted.

Figure 15:
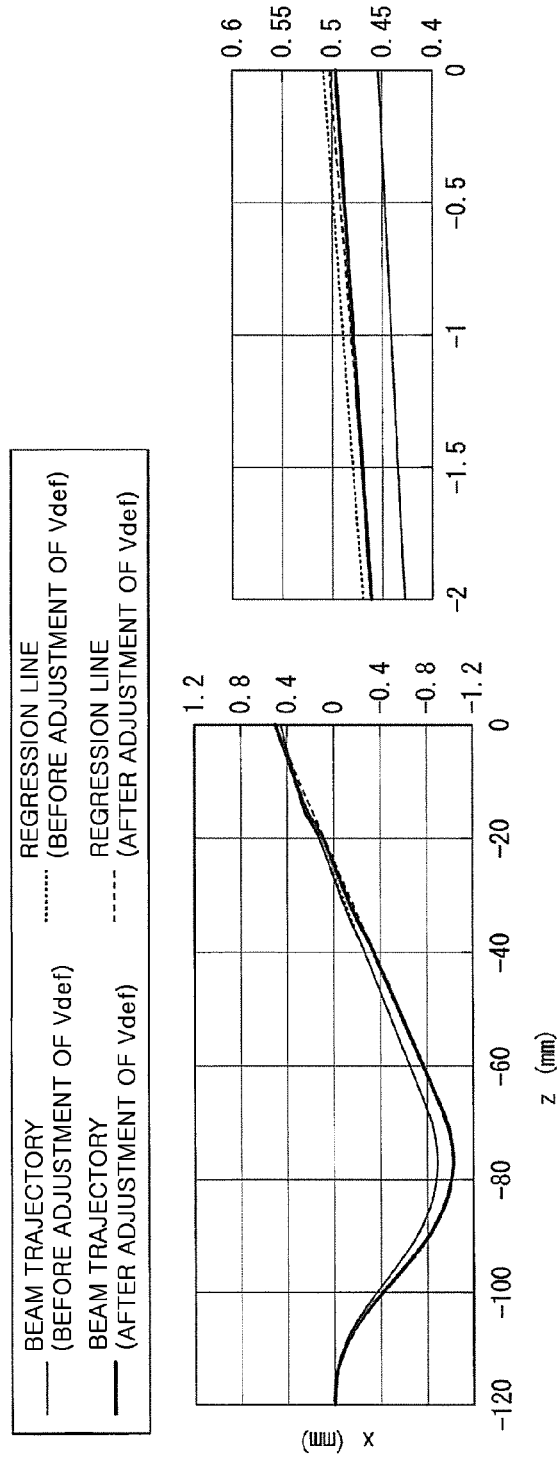
FIG. 15 shows graphs of an example of an ion beam trajectory.

FIG. 15 shows graphs of an example of the ion beam trajectory. In FIG. 15, an X axis and a Z axis are as illustrated in FIG. 8. FIG. 15 shows a case in which the operation mode is the acceleration mode, the acceleration voltage value Eacc is 5 kV, and the beam booster voltage value Eb is 5 kV.

In this example, it is assumed, by way of example, that the first scanning voltage value EdefU is 80 V, and the second scanning voltage value EdefL is 74.94 V. In this case, the ratio of "first scanning voltage value EdefU:second scanning voltage value EdefL" is 1:0.937.

FIG. 15 shows the trajectory of the ion beam B from when the ion beam B enters the first scanning electrode until when the ion beam B reaches the sample surface, and a result of fitting a regression line to the trajectory of the ion beam B as in FIG. 9 before and after adjustment of the scanning voltage value Edef.

As can be understood from the left-hand graph of FIG. 15, the trajectory of the ion beam B and the result of fitting the regression line to the trajectory of the ion beam B cross each other at the image plane. That is, the trajectory of the ion beam B can be approximated with the straight line and considered to be free from the lens action, and thus can be considered to pass through the principal surface.

The right-hand graph of FIG. 15 shows a comparison result of the principal surface between before and after adjustment of the scanning voltage value Edef shown in the left-hand graph of FIG. 15. Before the adjustment of the scanning voltage value Edef, Z is −26.4 mm, whereas after the adjustment of the scanning voltage value Edef, Z is −23.7 mm. That is, it can be understood that the application of the booster voltage value being 5 kV causes deviation of the principal surface by about 2.7 mm compared with the case of applying no booster voltage Vb. It can be understood from the foregoing that when the booster voltage Vb is changed, the deviation of the principal surface occurs, and thus it is required to perform adjustment with the ratio between the first scanning voltage value EdefU and the second scanning voltage value EdefU, and magnitudes of the first scanning voltage value EdefU and the second scanning voltage value EdefL.

The right-hand graph of FIG. 15 is an enlarged graph of a portion of the left-hand graph of FIG. 15, which shows a result of fitting the regression line to the trajectory of the ion beam B at Z=0 mm. As can be understood from the right-hand graph of FIG. 15, after the adjustment of the scanning voltage value Edef, Z is 0 mm at X=0.5 mm.

The scanning voltage information 92a of FIG. 12 is derived from the foregoing.

Next, processing for setting the beam booster voltage value Eb, the first voltage value EdefU, and the second voltage value EdefL is described in relation to an operation of the charged particle beam apparatus.

Figure 16:
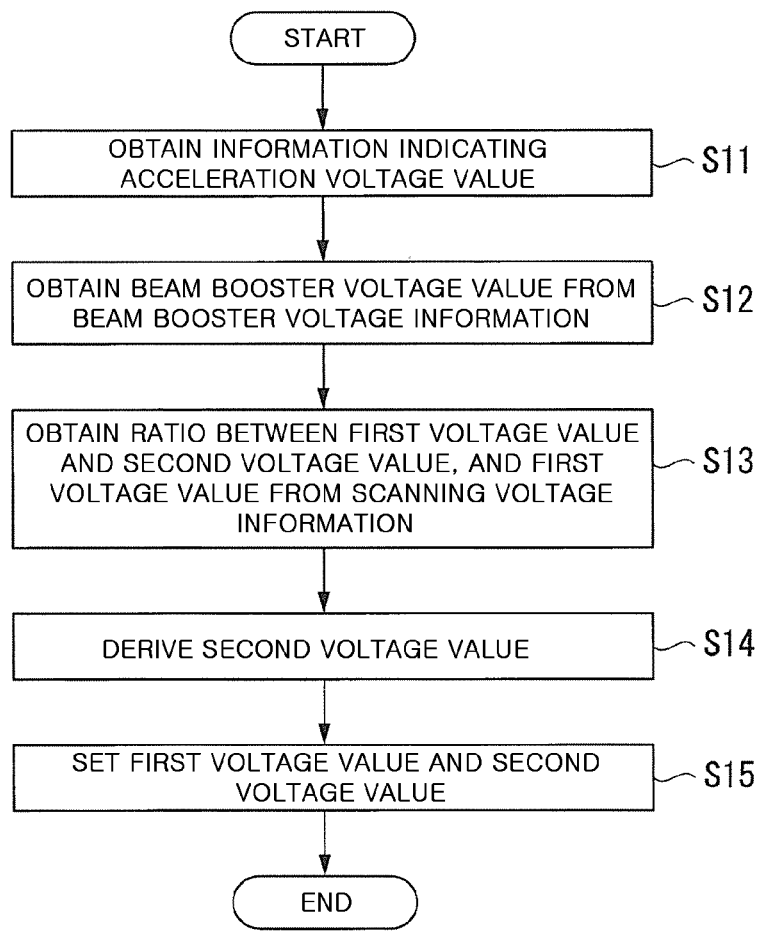
FIG. 16 is a flow chart for illustrating an operation example of the charged particle beam apparatus according to Modification Example 1 of the first embodiment.

FIG. 16 is a flow chart for illustrating an operation example of the charged particle beam apparatus according to Modification Example 1 of the first embodiment.

(Step S11)

In the charged particle beam apparatus D1, the processing unit 90a obtains the acceleration voltage value Eacc from the PC 17.

(Step S12)

In the charged particle beam apparatus D1, the processing unit 90a reads out the beam booster voltage information 93a from the storage unit 91a. The processing unit 90a obtains, from the read beam booster voltage information 93a, the beam booster voltage value Eb associated with the obtained acceleration voltage value Eacc.

(Step S13)

In the charged particle beam apparatus D1, the processing unit 90a reads out the scanning voltage information 92a from the storage unit 91a. The processing unit 90a obtains, from the read scanning voltage information 92a, a ratio between the first voltage value and the second voltage value and a first voltage value associated with a combination of the acceleration voltage value Eacc and the obtained beam booster voltage value Eb.

(Step S14)

In the charged particle beam apparatus D1, the processing unit 90a derives a second voltage value based on the obtained ratio between the first voltage value and the second voltage value, and the obtained first voltage value.

(Step S15)

In the charged particle beam apparatus D1, the processing unit 90a sets the first voltage value and the derived second voltage value in the MCU 60. It should be noted here that the polarities of the first voltage value and the second voltage value are required to be inverted.

Further, the first voltage value is a value that ensures a particular scanning width on the sample, and is, for example, a value for scanning with a 0.5 mm width. Further, when the polarities of the first voltage value and the second voltage value are inverted, scanning is performed in an opposite direction.

After setting the first voltage value and the second voltage value in the MCU 60 in Step S15, the first voltage value and the second voltage value can be changed based on the ratio between the first voltage value and the second voltage value, to thereby change a scanning range to a desired range. The first voltage value and the second voltage value are changed based on the ratio between the first voltage value and the second voltage value, and hence a precise scanned image with no distortion can be obtained.

The charged particle beam apparatus D1 according to Modification Example 1 of the first embodiment includes: a charged particle source (in the first embodiment, ion emitter E) configured to generate charged particles; a plurality of scanning electrodes configured to generate electric fields for deflecting charged particles that are emitted by applying an acceleration voltage to the charged particle source and applying an extraction voltage to an extraction electrode configured to extract the charged particles; an electrostatic lens (in the first embodiment, objective lens), which is provided between the plurality of scanning electrodes and a sample table, and is configured to focus the charged particle beam scanned with a scanning voltage; and a processing unit configured to obtain measurement conditions (in this case, acceleration voltage value Eacc and booster voltage value Eb) and set each of a plurality of scanning voltages based on the obtained measurement conditions and information that specifies a position of a principal surface of the electrostatic lens.

With this configuration, in the charged particle beam apparatus including the electrostatic lens, for example, the objective lens OL and two-stage scanning electrodes installed in the previous stage of the electrostatic lens, when the application voltage of the booster electrode that forms the objective lens is changed, the scanned image of the sample surface can be obtained without any distortion and with a precise dimension at the same level as an image before the change. Further, even when a measurement condition (in this example, booster voltage value Eb) is changed, and a position of the principal surface of the electrostatic lens is changed, each of the plurality of scanning voltages can be set based on the changed measurement condition, and hence the trajectory of the ion beam B can be changed. Thus, the lens action that may be exerted on the scanned beam can be reduced.

Modification Example 2 of First Embodiment

The configuration of FIG. 5 can be applied to the configuration of a charged particle beam apparatus according to Modification Example 2 of the first embodiment. The charged particle beam apparatus according to Modification Example 2 of the first embodiment differs from the charged particle beam apparatus D1 according to the first embodiment in that the beam booster voltage Vb is applied to the ion beam B. That is, in the configuration of the charged particle beam apparatus described with reference to FIG. 5, the alignment electrode 41, the astigmatism correction electrode 42, and the blanking electrode 43 included in the beam booster 4b are not omitted. Further, the alignment power supply 61, the astigmatism correction power supply 62, and the blanking power supply 63 included in the beam booster control unit 6 are not omitted. The beam booster power supply unit 7 is not omitted. The charged particle beam apparatus according to Modification Example 2 of the first embodiment includes a control unit 9b in place of the control unit 9.

The configuration of the control unit 9b is described in detail.

Figure 17:
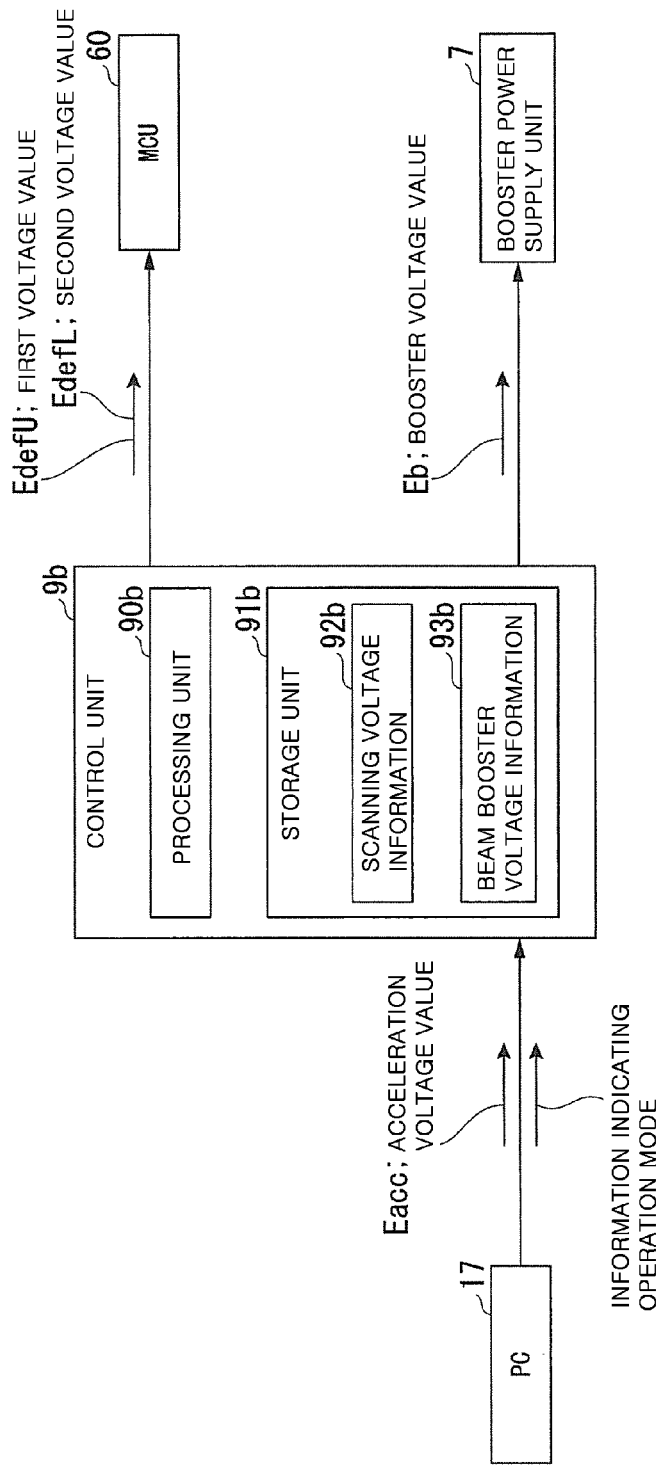
FIG. 17 is a diagram for illustrating a configuration example of a control unit in a charged particle beam apparatus according to Modification Example 2 of the first embodiment.

FIG. 17 is a diagram for illustrating a configuration example of the control unit 9b in the charged particle beam apparatus according to Modification Example 2 of the first embodiment. The control unit 9b includes a processing unit 90b and a storage unit 91b. In the storage unit 91b, scanning voltage information 92b and beam booster voltage information 93b are stored.

The processing unit 90b is configured to derive the beam booster voltage value Eb being a value of the beam booster voltage Vb based on the acceleration voltage value Eacc supplied from the PC 17 and the beam booster voltage information 93b read out from the storage unit 91a. The processing unit 90b is configured to supply the calculated beam booster voltage value Eb to the beam booster power supply unit 7.

The processing unit 90b is configured to derive the first voltage value EdefU being a value of the first voltage VdefU and the second voltage value EdefL being a value of the second voltage VdefL based on the acceleration voltage value Eacc supplied from the PC 17, the information indicating the operation mode, and the derived beam booster voltage value Eb. The processing unit 90b is configured to output the derived first voltage value EdefU and second voltage value EdefL to the MCU 60.

The scanning voltage information 92b is information having a table format in which the acceleration voltage value Eacc, information indicating the operation mode, the beam booster voltage value Eb, information indicating a ratio between the first voltage value EdefU and the second voltage value EdefL, and the first voltage value EdefU are associated with one another.

As an example of the scanning voltage information 92b, the scanning voltage information 92a can be applied, and as the beam booster voltage information 93b, the beam booster voltage information 93a can be applied.

Next, processing for setting the beam booster voltage value Eb, the first voltage value EdefU, and the second voltage value EdefL is described in relation to an operation of the charged particle beam apparatus.

Figure 18:
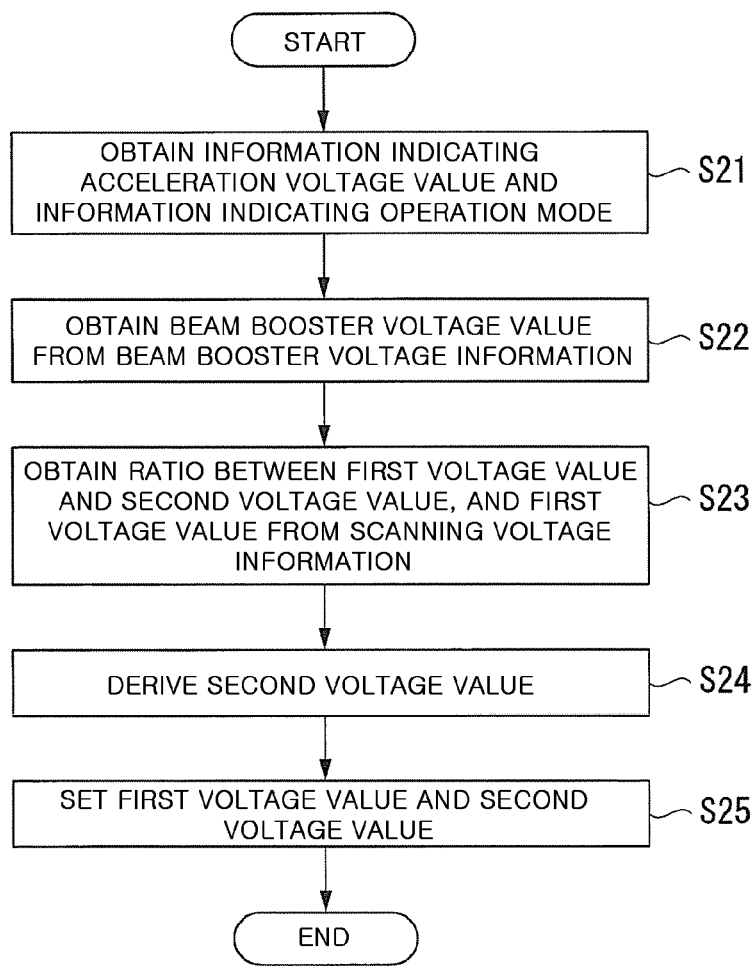
FIG. 18 is a flowchart for illustrating an operation example of the charged particle beam apparatus according to Modification Example 2 of the first embodiment.

FIG. 18 is a flow chart for illustrating an operation example of the charged particle beam apparatus according to Modification Example 2 of the first embodiment.

(Step S21)

In the charged particle beam apparatus D1, the processing unit 90b obtains, from the PC 17, the acceleration voltage value Eacc and information indicating the operation mode.

(Step S22)

In the charged particle beam apparatus D1, the processing unit 90b reads out from the storage unit 91b the beam booster voltage information 93b. The processing unit 90b obtains, from the read beam booster voltage information 93b, the beam booster voltage value Eb associated with the obtained acceleration voltage value Eacc.

(Step S23)

In the charged particle beam apparatus D1, the processing unit 90b reads out the scanning voltage information 92b from the storage unit 91b. The processing unit 90b obtains, from the read scanning voltage information 92b, a ratio between the first voltage value and the second voltage value and a first voltage value associated with a combination of the acceleration voltage value Eacc, the information indicating the operation mode, and the obtained beam booster voltage value Eb.

(Step S24)

In the charged particle beam apparatus D1, the processing unit 90b derives a second voltage value based on the obtained ratio between the first voltage value and the second voltage value, and the obtained first voltage value.

(Step S25)

In the charged particle beam apparatus D1, the processing unit 90b sets the first voltage value and the derived second voltage value in the MCU 60. It should be noted here that the polarities of the first voltage value and the second voltage value are required to be inverted.

Further, the first voltage value is a value that ensures a particular scanning width on the sample, and is, for example, a value for scanning with a 0.5 mm width. Further, when the polarities of the first voltage value and the second voltage value are inverted, scanning is performed in an opposite direction.

After the first voltage value and the second voltage value are set in the MCU 60 in Step S25, the first voltage value and the second voltage value can be changed based on the ratio between the first voltage value and the second voltage value, to thereby change a scanning range to a desired range. The first voltage value and the second voltage value are changed based on the ratio between the first voltage value and the second voltage value, and hence a precise scanned image with no distortion can be obtained.

The charged particle beam apparatus D1 according to Modification Example 2 of the first embodiment includes: a charged particle source (in the first embodiment, ion emitter E) configured to generate charged particles; a plurality of scanning electrodes configured to generate electric fields for deflecting charged particles that are emitted by applying an acceleration voltage to the charged particle source and applying an extraction voltage to an extraction electrode configured to extract the charged particles; an electrostatic lens (in the first embodiment, objective lens), which is provided between the plurality of scanning electrodes and a sample table, and is configured to focus the charged particle beam scanned with a scanning voltage; and a processing unit configured to obtain measurement conditions (in this case, acceleration voltage value Eacc, booster voltage value Eb, and information indicating operation mode) and set each of a plurality of scanning voltages based on the obtained measurement conditions and information that specifies a position of a principal surface of the electrostatic lens.

With this configuration, in the charged particle beam apparatus including the electrostatic lens, for example, the objective lens OL and the two-stage scanning electrodes installed in the previous stage of the electrostatic lens, when the objective lens is switched between the acceleration mode and the deceleration mode, or an application voltage of the booster electrode that forms the objective lens is changed, the scanned image of the sample surface can be obtained without any distortion and with a precise dimension at the same level as an image before the switching or the change. Further, even when one of the measurement conditions (in this example, acceleration voltage value Eacc, booster voltage value Eb, and information indicating operation mode) is changed, and a position of the principal surface of the electrostatic lens is changed, each of the plurality of scanning voltages can be set based on the changed measurement condition, and hence the trajectory of the ion beam B can be changed. Thus, the lens action that may be exerted on the scanned beam can be reduced.

Second Embodiment

A composite charged particle beam apparatus D according to a second embodiment of the present invention includes a scanning electron microscope D2 (not shown), for example, an electron beam column, in addition to the charged particle beam apparatus D1 described with reference to FIG. 5. Here, the alignment electrode 41, the astigmatism correction electrode 42, and the blanking electrode 43 included in the beam booster 4b are not omitted. Further, the alignment power supply 61, the astigmatism correction power supply 62, and the blanking power supply 63 included in the beam booster control unit 6 are not omitted. The beam booster power supply unit 7 is not omitted.

The scanning electron microscope D2 is configured to irradiate the sample SP1 with an electron beam and detect secondary electrons emitted from, or electrons reflected by, the sample SP1, to thereby observe the surface or cross section of the sample SP1.

The composite charged particle beam apparatus D according to the second embodiment is configured to apply the electron beam and the focused ion beam to the same position on the sample. In order to apply the electron beam and the focused ion beam to the same position on the sample, focus positions of the electron beam and the focused ion beam are required to match each other at the same position (irradiation position) on the sample. The same position on the sample irradiated with the electron beam and the focused ion beam is referred to as "coincidence point (CP)."

The composite charged particle beam apparatus according to the second embodiment includes a control unit 9c in place of the control unit 9.

The configuration of the control unit 9c is described in detail.

Figure 19:
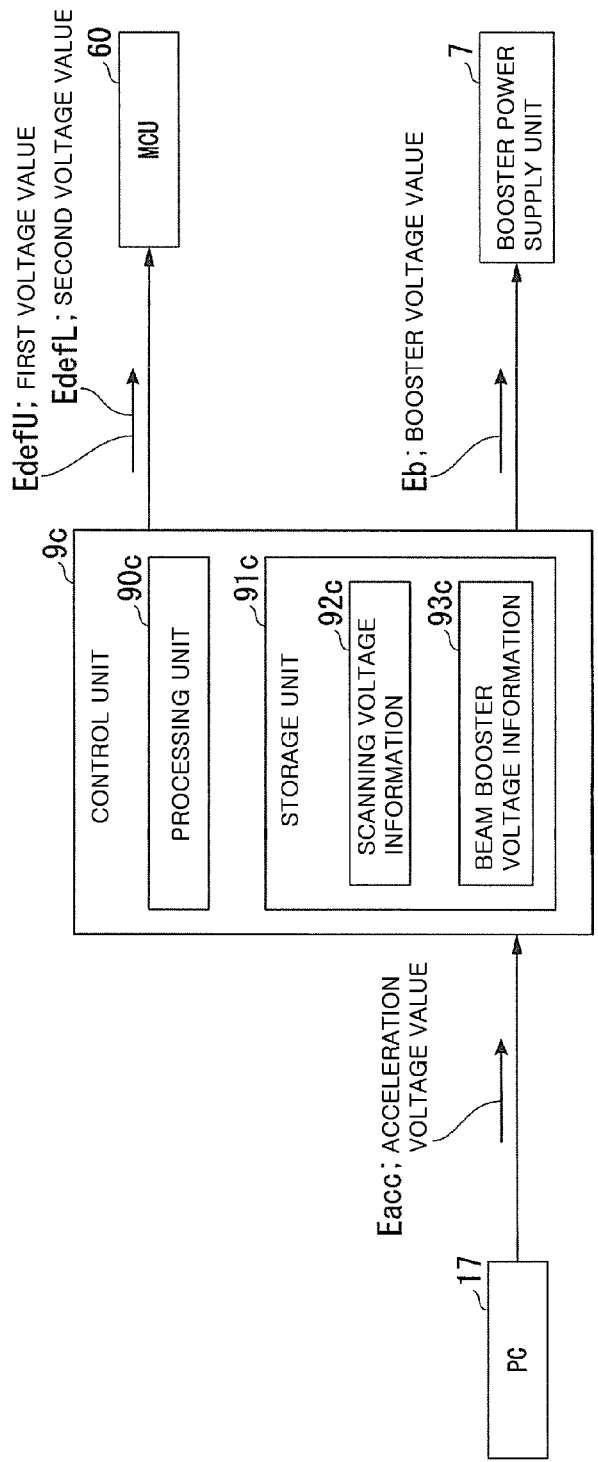
FIG. 19 is a diagram for illustrating a configuration example of a control unit in a composite charged particle beam apparatus according to a second embodiment of the present invention.

FIG. 19 is a diagram for illustrating a configuration example of the control unit 9c in the composite charged particle beam apparatus according to the second embodiment. The control unit 9c includes a processing unit 90c and a storage unit 91c. In the storage unit 91c, scanning voltage information 92c and beam booster voltage information 93c are stored.

The processing unit 90c is configured to derive the beam booster voltage value Eb being a value of the beam booster voltage Vb based on the acceleration voltage value Eacc supplied from the PC 17 and the beam booster voltage information 93c read out from the storage unit 91c. The processing unit 90c is configured to supply the calculated beam booster voltage value Eb to the beam booster power supply unit 7.

The processing unit 90c is configured to derive the first voltage value EdefU being a value of the first voltage VdefU and the second voltage value EdefL being a value of the second voltage VdefL based on the acceleration voltage value Eacc supplied from the PC 17 and the derived beam booster voltage value Eb. The processing unit 90c outputs the derived first voltage value EdefU and second voltage value EdefL to the MCU 60.

The scanning voltage information 92c is information having a table format in which the acceleration voltage value Eacc, the beam booster voltage value Eb, information indicating a ratio between the first voltage value EdefU and the second voltage value EdefL, and the first voltage value EdefU are associated with one another.

As an example of the scanning voltage information 92c, the scanning voltage information 92a described with reference to FIG. 12 can be applied.

The beam booster voltage information 93c is information having a table format in which the acceleration voltage value Eacc, and a beam booster voltage set value TEb calculated in advance in accordance with a desired focal length are associated with each other. The beam booster voltage set value TEb is a voltage value that allows the electron beam and the focused ion beam to be focused onto the same position, that is, CP on the sample when the acceleration voltage value Eacc is applied. With the composite charged particle beam apparatus D2, the beam booster voltage set value TEb is set based on the beam booster voltage information 93c, and as a result, the ion beam B and the electron beam are applied to the same position on the sample SP1.

A range of the beam booster voltage Vb that allows focusing is shown in FIG. 13, and thus description thereof is omitted here.

With the composite charged particle beam apparatus D2 according to the second embodiment, the beam booster voltage value Eb can be derived based on the acceleration voltage value Eacc, the focal length of the charged particle beam focused by the objective lens, and the focal length of an electron beam applied by an electron beam irradiation unit configured to apply the electron beam, and hence the charged particle beam can be focused onto the CP. That is, the value of the beam booster voltage Vb of the booster tube 4a (beam booster voltage value Eb), which allows the focused ion beam to be focused onto the CP, can be set in accordance with the acceleration voltage applied to the charged particle beam (ion beam B).

A part, for example, the control unit 9 (9, 9a, 9b, and 9c) of the charged particle beam apparatus D1 of the first embodiment described above and the composite charged particle beam apparatus D2 of the second embodiment described above may be implemented by a computer. In this case, the control unit may be implemented by recording a program for implementing the control functions on a computer-readable recording medium so that a computer system reads and executes the program recorded on the recording medium. The "computer system" used herein refers to a computer system incorporated in the charged particle beam apparatus D1 or the composite charged particle beam apparatus D2. This computer system is assumed to include an OS, peripheral devices, or other hardware. Further, the "computer-readable recording medium" refers to a portable medium such as a flexible disk, a magneto-optical disk, a ROM, or a CD-ROM, and a storage device such as a hard disk drive incorporated in the computer system. Further, the "computer-readable recording medium" may include a medium configured to dynamically hold a program for a short period of time like a communication line for transmitting a program via a network such as the Internet or a communication link such as a telephone line. Further, in that case, the "computer-readable recording medium" may include a medium configured to hold the program for a certain period of time like a server or a volatile memory in a client computer system. Further, the above-mentioned program may be configured to implement a part of the above-mentioned functions, or may be configured to implement the above-mentioned functions in combination with a program pre-installed in the computer system.

Further, a part or all of the control unit 9 in the first and second embodiments described above may be implemented as an integrated circuit, for example, a large scale integration (LSI) circuit. Functional blocks of the control unit 9 may be provided as different processors, or a part or all of those functional blocks may be integrated into a processor. Further, a technique of forming an integrated circuit is not limited to the LSI, and an integrated circuit may be configured by a dedicated circuit or a general-purpose processor instead. Further, in a case in which, along with progress of a semiconductor technology, a new technology of forming an integrated circuit is developed as a substitute for the LSI, an integrated circuit obtained with such technology may be used.

At least one embodiment of the present invention is described in detail above with reference to the drawings, but the specific configuration thereof is not limited to the foregoing ones, and the present invention encompasses various design modifications and changes within the scope of the gist of the present invention.

What is claimed is:

1. A charged particle beam apparatus, comprising:
   a charged particle source configured to generate charged particles;
   an extraction power supply configured to apply an extraction voltage to an extraction electrode to extract the charged particles from the charged particle source;
   an acceleration power supply configured to apply an acceleration voltage to the charged particles generated by the charged particle source in order to form a charged particle beam and accelerate the charged particle beam;
   a plurality of scanning electrodes configured to generate electric fields for deflecting the charged particle beam so as to scan the charged particle beam on a sample;
   an electrostatic lens, which is provided between the plurality of scanning electrodes and a sample table, and is configured to focus the charged particle beam deflected by the plurality of scanning electrodes; and
   a processing unit configured to obtain a measurement condition influencing a position of a principal surface of the electrostatic lens, and set each of scanning voltages to be applied to the plurality of scanning electrodes based on the obtained measurement condition.

2. The charged particle beam apparatus according to claim 1,
   wherein the processing unit is configured to obtain, from scanning voltage information in which a measurement condition and information that specifies a scanning voltage to be applied by each of the plurality of scanning electrodes are associated with each other, a plurality of pieces of information that each specify a scanning voltage corresponding to the obtained measurement condition, so as to set each of the plurality of scanning voltages based on the obtained plurality of pieces of information that each specify a scanning voltage, and
   wherein the scanning voltage information is derived based on the measurement condition.

3. The charged particle beam apparatus according to claim 1, wherein the plurality of scanning electrodes include:
   a first scanning electrode configured to apply a first scanning voltage to the charged particle beam; and
   a second scanning electrode, which is provided between the first scanning electrode and the sample table, and is configured to apply a second scanning voltage to the charged particle beam.

4. The charged particle beam apparatus according to of claim 1, wherein the measurement condition includes information that specifies the acceleration voltage and information that specifies an operation mode.

5. The charged particle beam apparatus according to claim 1, further comprising a beam booster voltage application unit, which is provided between the charged particle source and the sample table, and is configured to apply a beam booster voltage to the charged particle beam,
   wherein the measurement condition includes information that specifies the acceleration voltage and information that specifies the beam booster voltage.

6. The charged particle beam apparatus according to claim 5, wherein the processing unit is configured to obtain, from beam booster voltage information in which a measurement condition and information that specifies a beam booster voltage to be applied by the beam booster voltage application unit are associated with each other, information that specifies a beam booster voltage corresponding to the obtained measurement condition, and set the beam booster voltage information based on the obtained information that specifies a beam booster voltage.

7. A composite charged particle beam apparatus, comprising:
the charged particle beam apparatus of claim 5; and
an electron beam column,
wherein the processing unit is configured to set the beam booster voltage based on the acceleration voltage, a focal length of the charged particle beam focused by the electrostatic lens, and an irradiation position of an electron beam applied by an electron beam irradiation unit configured to apply the electron beam.

8. The composite charged particle beam apparatus according to claim 7, wherein a focus position of the charged particle beam focused by the electrostatic lens matches the irradiation position of the electron beam.

9. The composite charged particle beam apparatus according to claim 7, wherein the processing unit is configured to obtain, from beam booster voltage information in which a measurement condition and information that specifies a beam booster voltage to be applied by the beam booster voltage application unit are associated with each other, information that specifies a beam booster voltage corresponding to the obtained measurement condition, and set the beam booster voltage information based on the obtained information that specifies a beam booster voltage.

10. A control method for a charged particle beam apparatus, comprising:
causing a charged particle source to emit charged particles by applying an acceleration voltage to the charged particle source and applying an extraction voltage to an extraction electrode configured to extract the charged particles;
obtaining a measurement condition to set, based on the obtained measurement condition, each of a plurality of scanning voltages to be applied to a plurality of scanning electrodes configured to generate electric fields for deflecting the charged particles so as to scan a charged particle beam on a sample;
applying a scanning voltage to each of the plurality of scanning electrodes based on each of the set plurality of scanning voltages; and
causing an electrostatic lens, which is provided between the plurality of scanning electrodes and a sample table, to focus the charged particles deflected by the plurality of scanning voltages, wherein the measurement condition is a condition influencing a position of a principal surface of the electrostatic lens.

* * * * *